US011552155B2

(12) United States Patent
Park et al.

(10) Patent No.: US 11,552,155 B2
(45) Date of Patent: Jan. 10, 2023

(54) METHOD FOR MANUFACTURING DISPLAY DEVICE

(71) Applicant: Samsung Display Co., Ltd., Yongin-Si (KR)

(72) Inventors: Chan-Jae Park, Suwon-si (KR); Sangduk Lee, Yongin-si (KR); Heeju Woo, Tongyeong-si (KR); Kikyung Youk, Bucheon-si (KR); Hyun a Lee, Seoul (KR); Daehwan Jang, Seoul (KR)

(73) Assignee: SAMSUNG DISPLAY CO., LTD., Gyeonggi-Do (KR)

( * ) Notice: Subject to any disclaimer, the term of this patent is extended or adjusted under 35 U.S.C. 154(b) by 181 days.

(21) Appl. No.: 16/944,707

(22) Filed: Jul. 31, 2020

(65) Prior Publication Data
US 2021/0151543 A1    May 20, 2021

(30) Foreign Application Priority Data
Nov. 18, 2019   (KR) .......................... 10-2019-0147989

(51) Int. Cl.
*H01L 27/32* (2006.01)
*H01L 23/00* (2006.01)

(52) U.S. Cl.
CPC .......... *H01L 27/3276* (2013.01); *H01L 24/81* (2013.01); *H01L 24/83* (2013.01); *H01L 24/92* (2013.01); *H01L 27/323* (2013.01); *H01L 2224/81125* (2013.01);
(Continued)

(58) Field of Classification Search
CPC ...... H05K 1/028; H05K 5/0017; H05K 3/244; H05K 3/323; H05K 3/361; H01L 27/323; H01L 24/83; H01L 24/81; H01L 24/92; H01L 27/3276; H01L 23/49811; H01L 24/16; H01L 24/13; H01L 51/5256; H01L 27/3248; H01L 23/4985; H01L 51/5012; H01L 51/5246; H01L 27/3246; H01L 51/5206; H01L 27/3258; H01L 27/124; H01L 27/3262; H01L 41/047; Y02P 70/50; G02F 1/133345; G02F 1/136227; H03H 9/0547; H03H 9/1021; H03H 9/0538; H03B 5/32; H03B 9/19; H03B 9/0519;
(Continued)

(56) References Cited

U.S. PATENT DOCUMENTS 9,957,411 B2    5/2018 Saito et al.
9,980,376 B1 *  5/2018 Kim .................... H05K 1/0393
2003/0139004 A1  7/2003 Yoshida
(Continued)

FOREIGN PATENT DOCUMENTS

JP    2002270642 A   9/2002
JP    4752586 B2     8/2011
(Continued)

*Primary Examiner* — Mouloucoulaye Inoussa
(74) *Attorney, Agent, or Firm* — Cantor Colburn LLP

(57) ABSTRACT

A method for manufacturing a display device includes providing an electronic component between a plurality of bumps, providing a display panel, aligning the electronic component and the display panel, and applying ultrasonic waves to bond the plurality of bumps to signal pads. In providing first adhesive members, at least a portion of a top surface of each of the plurality of bumps is exposed between the first adhesive members.

20 Claims, 21 Drawing Sheets

(52) U.S. Cl.
CPC .............. *H01L 2224/81207* (2013.01); *H01L 2224/83855* (2013.01); *H01L 2224/9211* (2013.01); *H01L 2227/323* (2013.01)

(58) Field of Classification Search
CPC .. H03B 9/09; G01C 19/5783; G01C 19/5621; B29C 65/08; Y10T 156/10
USPC .................. 257/23.065, 23.07; 156/73.1, 60; 385/14; 345/204; 313/582, 51; 361/777
See application file for complete search history.

(56) References Cited

U.S. PATENT DOCUMENTS

| | | | |
|---|---|---|---|
| 2005/0275113 A1* | 12/2005 | Park ................... | B81C 1/00238 257/778 |
| 2006/0244741 A1* | 11/2006 | Kimura ................ | G02F 1/1341 345/204 |
| 2007/0109759 A1* | 5/2007 | Torii ................ | H01L 23/49838 257/E23.07 |
| 2011/0097034 A1* | 4/2011 | Uemura .............. | G02B 6/4249 385/14 |
| 2013/0118672 A1* | 5/2013 | Park ........................ | B29C 65/08 156/60 |
| 2015/0064851 A1 | 3/2015 | Gallagher et al. | |
| 2016/0143174 A1* | 5/2016 | Cho ....................... | H05K 3/323 174/251 |
| 2016/0168428 A1* | 6/2016 | Shinohara ............. | H05K 3/323 428/206 |
| 2016/0212823 A1* | 7/2016 | Kim ....................... | H05B 33/06 |
| 2016/0240468 A1* | 8/2016 | Shinohara ............... | B32B 27/08 |
| 2018/0014405 A1* | 1/2018 | Kim ....................... | H01L 24/29 |
| 2018/0174952 A1* | 6/2018 | Kim ....................... | H05K 1/111 |
| 2018/0212009 A1* | 7/2018 | Odaka ................. | H01L 51/5012 |
| 2018/0226564 A1* | 8/2018 | Itayama ................. | H01L 41/27 |
| 2019/0181111 A1* | 6/2019 | Kim ....................... | H01L 24/13 |
| 2019/0181388 A1* | 6/2019 | Kim ....................... | G09F 9/301 |
| 2019/0198476 A1* | 6/2019 | Kim ....................... | H01L 24/81 |
| 2019/0220122 A1* | 7/2019 | Shin ...................... | G06F 3/044 |
| 2019/0223289 A1* | 7/2019 | Kim ....................... | H01L 27/3276 |
| 2019/0246190 A1* | 8/2019 | Park ..................... | G06V 40/1306 |
| 2019/0252481 A1* | 8/2019 | Kim ..................... | H01L 27/3258 |
| 2019/0317634 A1* | 10/2019 | Lee ....................... | G06F 3/0447 |
| 2019/0333978 A1* | 10/2019 | Lee ..................... | H01L 51/0097 |
| 2019/0348485 A1* | 11/2019 | Jo ............................ | H01L 24/16 |
| 2019/0348487 A1* | 11/2019 | Kim ....................... | H01L 24/81 |
| 2021/0321517 A1* | 10/2021 | Kim ........................ | G06F 1/183 |

FOREIGN PATENT DOCUMENTS

| | | |
|---|---|---|
| KR | 100614564 B1 | 8/2006 |
| KR | 1020090122514 A | 12/2009 |
| KR | 1020150027013 A | 3/2015 |
| KR | 101712046 B1 | 3/2017 |
| KR | 1020190098878 A | 8/2019 |

* cited by examiner

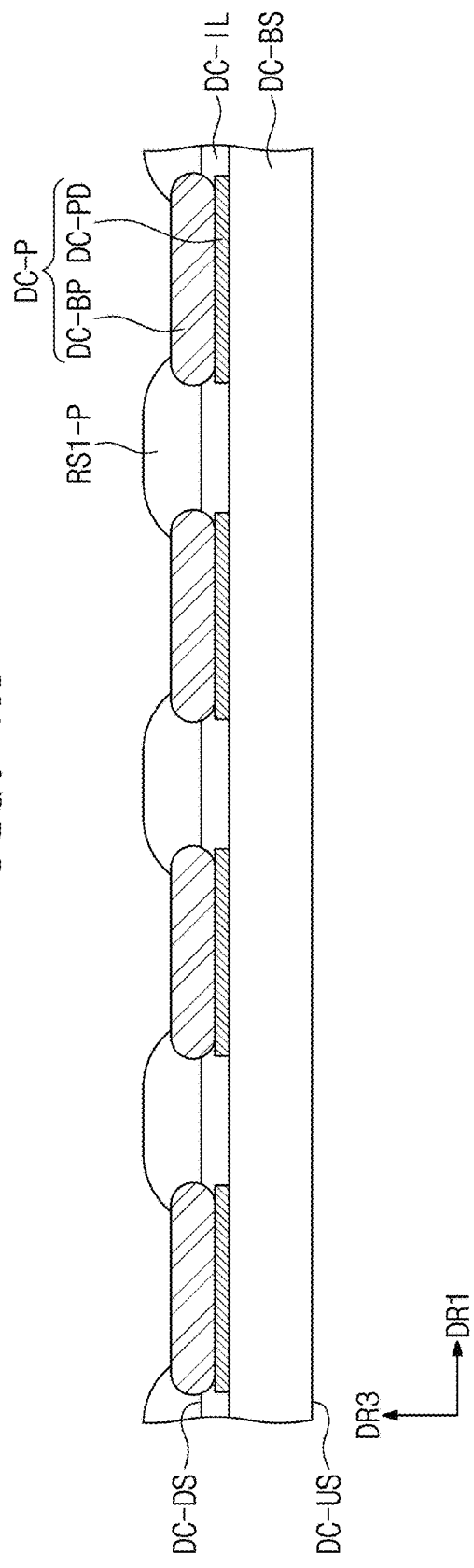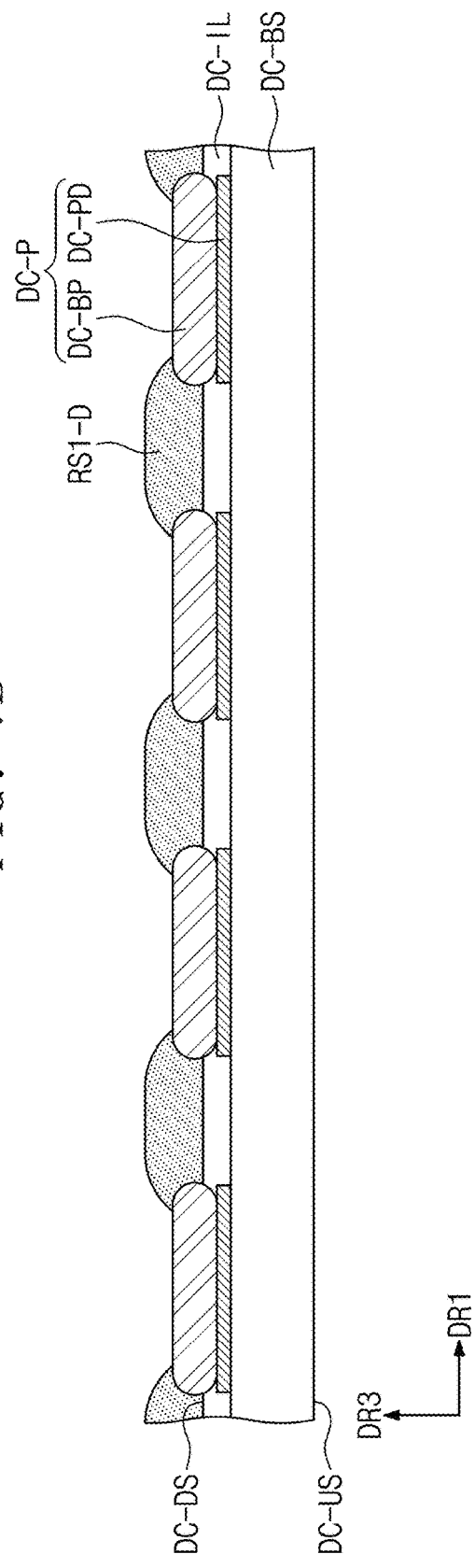

METHOD FOR MANUFACTURING DISPLAY DEVICE

This application claims priority to Korean Patent Application No. 10-2019-0147989, filed on Nov. 18, 2019, and all the benefits accruing therefrom under 35 U.S.C. § 119, the content of which in its entirety is herein incorporated by reference.

BACKGROUND

1. Field

Embodiments of the invention herein relate to a method for manufacturing a display device. More particularly, embodiments of the invention herein relate to an electronic component and a method for bonding a display panel.

2. Description of Related Art

Various display devices used in multimedia equipment such as televisions, mobile phones, table computers, navigation devices, and game consoles are being developed.

Such display devices include a display panel that displays an image. The display panel includes a plurality of gate lines, a plurality of data lines, a plurality of pixels connected to the plurality of gate lines and the plurality of data lines. The display devices may be connected to an electronic component that provides an electrical signal desired for displaying an image to the gate lines or the data lines.

The electronic component may be electrically connected to the display panel by an anisotropic conductive film or ultrasonic bonding. Among these methods, when the display panel and the electronic component are connected to each other by the ultrasonic bonding, conductivity may be improved, and process time may be reduced when compared to the case in which the display panel and the electronic component are connected to each other by the anisotropic conductive film.

SUMMARY

Embodiments of the invention provide a method for manufacturing a display device that is reduced in process time.

Embodiments of the invention also provide a method for manufacturing a display device that is improved in conductivity between a display panel and an electronic component.

An embodiment of the invention provides a method for manufacturing a display device, the method including providing an electronic component including a plurality of bumps, providing first adhesive members between the plurality of bumps, providing a display panel including a plurality of signal pads, aligning the electronic component and the display panel so that the plurality of bumps and the plurality of signal pads respectively correspond to each other, and applying ultrasonic waves and a pressure to the plurality of bumps and the plurality of signal pads to bond the plurality of bumps to the plurality of signal pads.

In an embodiment, in the providing the first adhesive members, at least a portion of a top surface of each of the plurality of bumps may be exposed between the first adhesive members.

In an embodiment, in the providing the first adhesive members, the top surface of each of the plurality of bumps may be exposed between the first adhesive members.

In an embodiment, in the providing the first adhesive members, each of the plurality of bumps may not overlap each of the first adhesive member in a plan view.

In an embodiment, in the providing the first adhesive members, each of the first adhesive members may be provided to protrude between the plurality of bumps.

In an embodiment, the method may further include drying or partially curing the first adhesive members between the providing first adhesive members and the aligning the electronic component and the display panel.

In an embodiment, in the bonding the plurality of bumps to the plurality of signal pads, heat may be applied to the plurality of bumps and the plurality of signal pads.

In an embodiment, each of the first adhesive members may be a thermosetting adhesive member, and in the bonding the plurality of bumps to the plurality of signal pads, heat may be applied to the first adhesive members.

In an embodiment, the method may further include providing second adhesive members between the plurality of signal pads.

In an embodiment, in the providing the second adhesive members, at least a portion of the top surface of each of the plurality of signal pads may be exposed between the second adhesive members.

In an embodiment, in the providing the second adhesive members, the top surface of each of the plurality of signal pads may be exposed between the second adhesive members.

In an embodiment, in the providing the first adhesive members, each of the first adhesive members may be provided so as not to protrude between the plurality of bumps.

In an embodiment, one of the first adhesive members and the second adhesive members may include a main material, and a remaining one of the first adhesive member and the second adhesive member may include a curing agent that curing-reacts with the main material.

In an embodiment, in the applying of the ultrasonic waves and the pressure to bond the plurality of bumps to the plurality of signal pads, the main material and the curing agent may be mixed with each other.

In an embodiment of the invention, a method for manufacturing a display device includes providing an electronic component including a plurality of bumps, providing a display panel including a plurality of signal pads, providing first adhesive members between the plurality of bumps, aligning the electronic component and the display panel so that the plurality of bumps and the plurality of signal pads respectively correspond to each other, and applying ultrasonic waves and a pressure to bond the plurality of bumps to the plurality of signal pads. In an embodiment, in the providing of the first adhesive members, each of the first adhesive members may not overlap at least a portion of each of the plurality of bumps in a plan view.

In an embodiment, in the providing of the first adhesive members, each of the first adhesive members may not overlap each of the plurality of bumps in the plan view.

In an embodiment, in the providing of the first adhesive members to the electronic component, each of the first adhesive members may be provided to protrude between the plurality of bumps.

In an embodiment, the method may further include drying or partially curing the first adhesive members between the providing of first adhesive members to the electronic component and the aligning of the electronic component and the display panel.

In an embodiment, the method may further include providing second adhesive members between the plurality of signal pads. In an embodiment, in the providing of the second adhesive members, each of the second adhesive members may not overlap each of the plurality of signal pads or overlap each of the plurality of signal pads in the plan view.

In an embodiment, each of the first adhesive members may be provided so as not to protrude between the plurality of bumps.

In an embodiment, each of the plurality of bumps may have a thickness greater than that of each of the plurality of signal pads. In an embodiment, each of the second adhesive members may include a curing agent that curing-reacts with the main material.

BRIEF DESCRIPTION OF THE DRAWINGS

The accompanying drawings are included to provide a further understanding of the invention, and are incorporated in and constitute a part of this specification. The drawings illustrate embodiments of the invention and, together with the description, serve to explain principles of the invention. In the drawings:

FIGS. 7A to 7G are cross-sectional views illustrating each process in FIGS. 6A to 6C;

DETAILED DESCRIPTION

Figure 1:
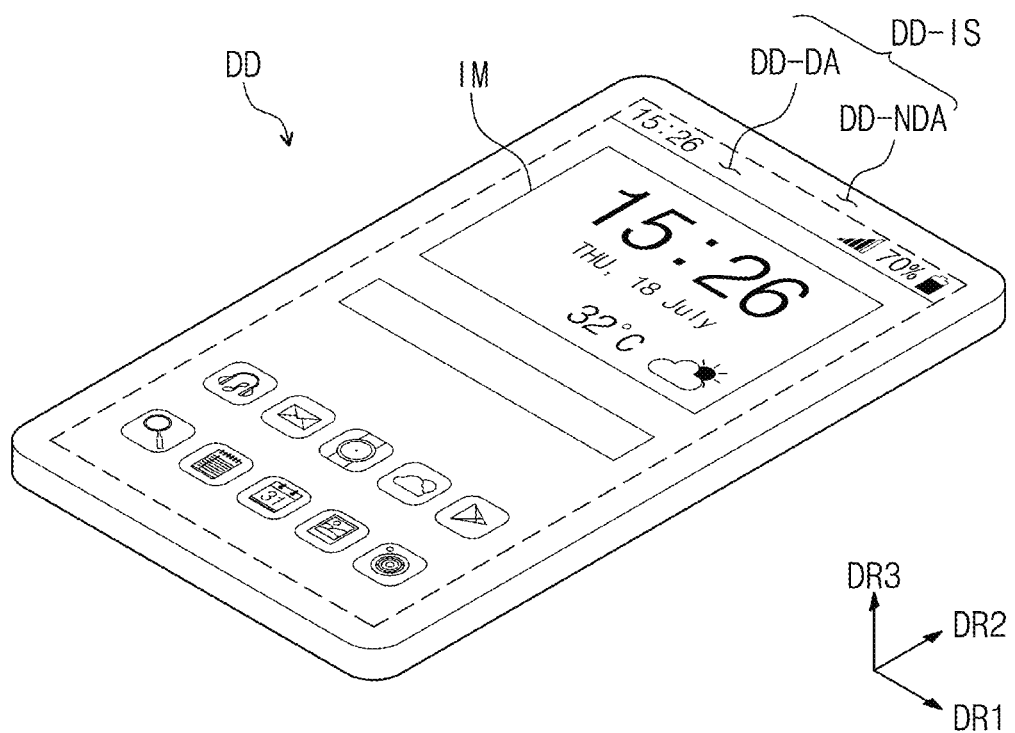
FIG. 1 is a perspective view of an embodiment of a display device according to the invention.

In this specification, it will also be understood that when one component (or region, layer, portion) is referred to as being "on", "connected to", or "coupled to" another component, it can be directly disposed/connected/coupled on/to the one component, or an intervening third component may also be present.

Like reference numerals refer to like elements throughout. Also, in the drawing figures, the thickness, ratio, and dimensions of components are exaggerated for clarity of illustration.

The term "and/or" includes any and all combinations of one or more of the associated listed items.

It will be understood that although the terms such as 'first' and 'second' are used herein to describe various elements, these elements should not be limited by these terms. The terms are only used to distinguish one component from other components. A first element referred to as a first element in an embodiment can be referred to as a second element in another embodiment without departing from the scope of the appended claims, for example. The terms of a singular form may include plural forms unless referred to the contrary.

Also, "under", "below", "above", "upper", and the like are used for explaining relation association of components illustrated in the drawings. The terms may be a relative concept and described based on directions expressed in the drawings.

Also, in this specification, a structure in which a layer, a film, a region, or a plate is disposed "on" another layer, film, region, or plate may include a structure in which the layer, film, region, or plate is disposed on a lower portion as well as an upper portion of another layer, film, region, or plate.

Unless otherwise defined, all terms (including technical and scientific terms) used herein have the same meaning as commonly understood by a person of ordinary skill in the art to which this invention belongs. Also, terms such as defined terms in commonly used dictionaries are to be interpreted as having meanings consistent with meaning in the context of the relevant art and are expressly defined herein unless interpreted in an ideal or overly formal sense.

The meaning of "include" or "comprise" specifies a property, a fixed number, a step, an operation, an element, a component or a combination thereof, but does not exclude other properties, fixed numbers, steps, operations, elements, components or combinations thereof.

Hereinafter, embodiments of the invention will be described with reference to the accompanying drawings.

Figure 2:
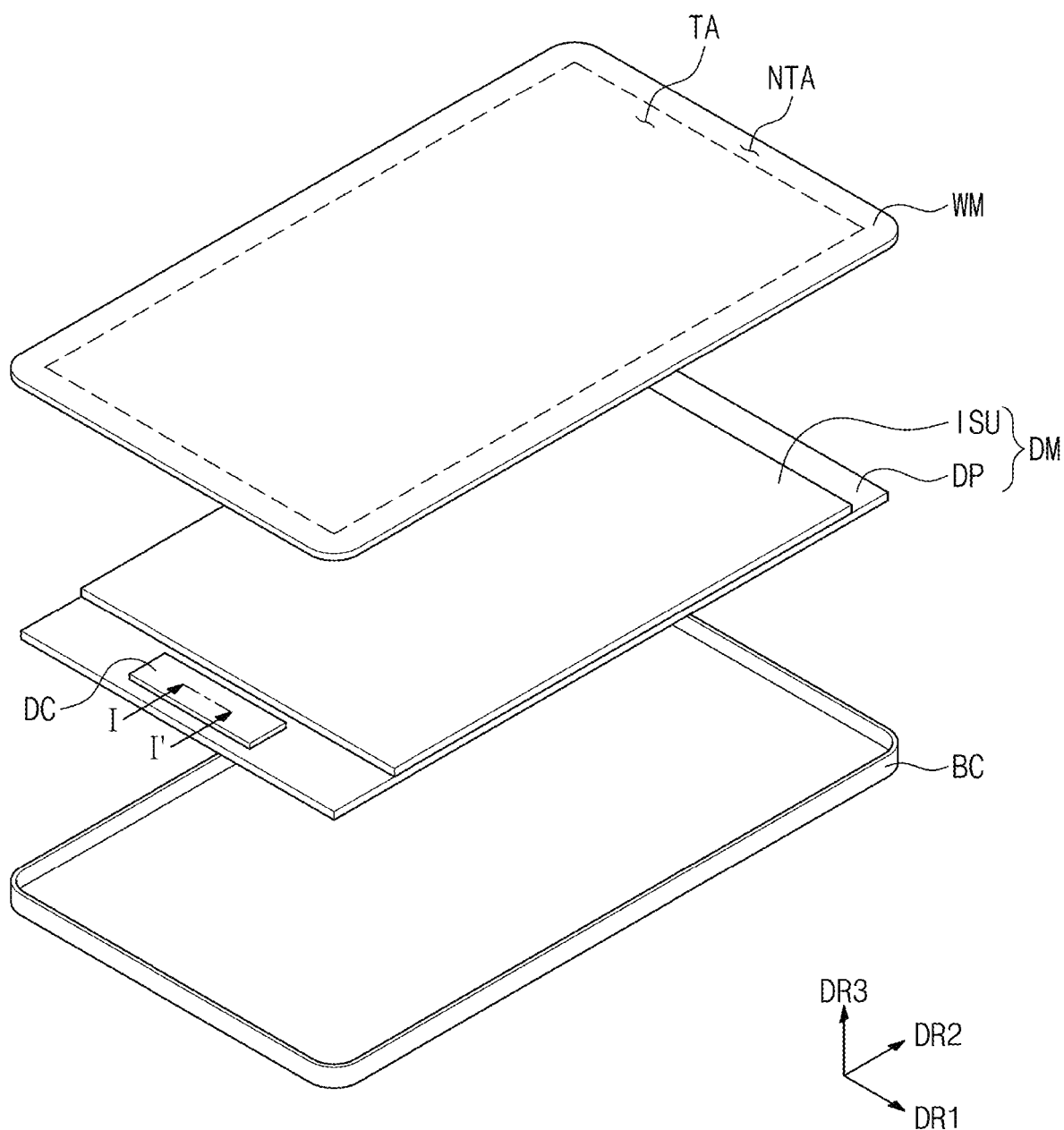
FIG. 2 is an exploded perspective view of an embodiment of the display device according to the invention.
Figure 3:
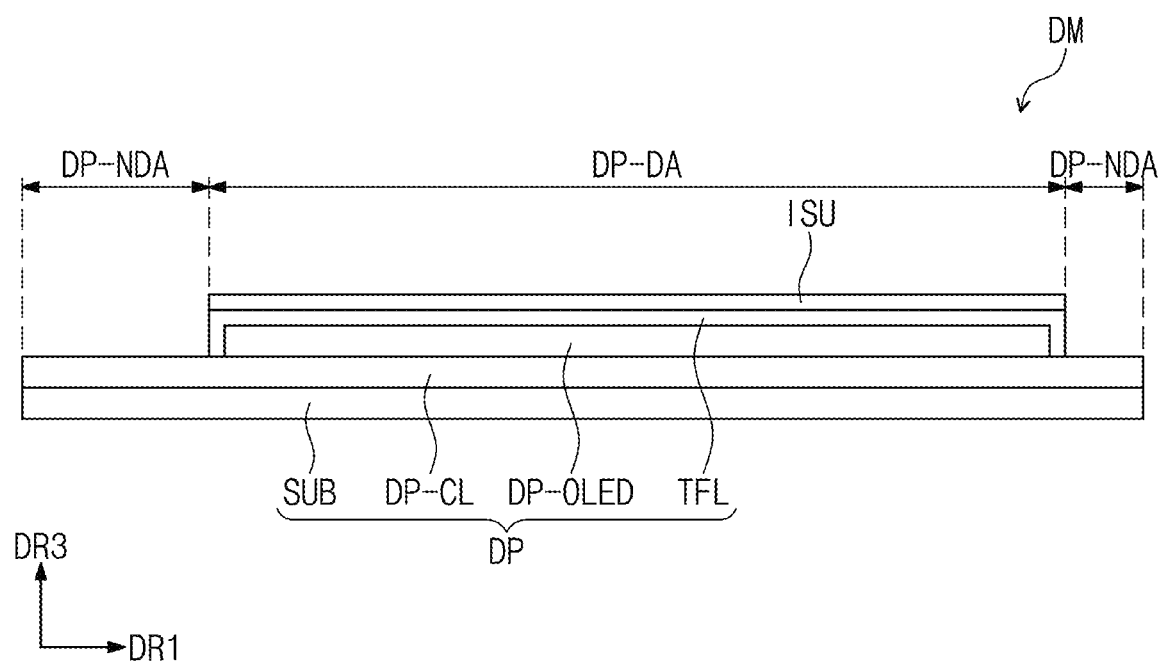
FIG. 3 is a cross-sectional view of an embodiment of the display panel according to the invention.

FIG. 1 is a perspective view of an embodiment of a display device according to the invention. FIG. 2 is an exploded perspective view of an embodiment of the display apparatus according to the invention. FIG. 3 is a cross-sectional view of an embodiment of the display panel according to the invention.

In this specification, a display device DD applicable to a mobile phone terminal is illustrated as an example. Although not shown, electronic modules, a camera module, a power module, and the like, which are disposed (e.g., mounted) on a main board, together with the display device DD may be disposed on a bracket/case to constitute the mobile terminal. The display device DD in an embodiment of the invention may be applied to large-sized electronic apparatuses such as televisions and monitors and small and middle-sized electronic apparatuses such as tablet personal computer ("PC"), navigation units for vehicles, game consoles, and smart watches.

Referring to FIG. 1, a display device DD may display an image IM through a display surface DD-IS. Icon images are illustrated as an example of the image IM in FIG. 1. The display surface DD-IS is parallel to a surface defined by a first direction DR1 and a second direction DR2. A normal direction of the display surface DD-IS, i.e., a thickness direction of the display device DD is indicated as a third direction DR3. In this specification, "a plan view" may mean a view in the third direction DR3. A front surface (or a top surface) and a rear surface (or a bottom surface) of each of layers or units, which will be described below, are distinguished by the third direction DR3. However, directions indicated as the first to third directions DR1, DR2, and DR3 may be changed into different directions, for example, opposite directions as a relative concept.

Also, the display surface DD-IS includes a display area DD-DA on which an image IM is displayed and a non-display area DD-NDA that is adjacent to the display area DD-DA. The non-display area DD-NDA may be an area on which an image is not displayed. However, the invention is not limited thereto. In another embodiment, the non-display area DD-NDA may be adjacent to one side of the display area DD-DA or be omitted.

Referring to FIG. 2, the display device DD may include a window WM, a display module DM, an electronic component DC, and an accommodating member BC. The accommodating member BC may accommodate the display module DM and be coupled to the window WM. In another embodiment, the accommodating member BC may be omitted.

The window WM may be disposed above the display module DM to transmit an image provided from the display module DM to the outside. The window WM includes a transmission area TA and a non-transmission area NTA. The transmission area TA may have a shape that overlaps the display area DD-DA to correspond to the display area DD-DA. That is, an image IM displayed on the display area DD-DA of the display device DD may be visible through the transmission area TA of the window WM from the outside.

The non-transmission area NTA may have a shape that overlaps the non-display area DD-NDA to correspond to the non-display area DD-NDA. The non-transmission area NTA may be an area having a light transmittance that is relatively less than that of the transmission area TA. However, the technical idea of the invention is not limited thereto, and the non-transmission area NTA may be omitted.

The window WM may include glass, sapphire, or plastic. Also, although the window WM is illustrated as a single layer, the window WM may include a plurality of layers. The window WM may include a base layer and at least one printed layer overlapping the non-transmission area NTA and disposed on a rear surface of the base layer. The printed layer may have a predetermined color. In an embodiment, the printed layer may have a black color or have other colors except for the black color, for example.

The display module DM is disposed between the window WM and the accommodating member BC. The display module DM includes a display panel DP and an input sensing layer ISU. In the specification, the display panel DP and the input sensing layer ISU may be described as an electronic panel.

The display panel DP generates an image to transmit the generated image to the window WM. In an embodiment of the invention, the display panel DP may be an emission type display panel, but is not limited thereto. In an embodiment, the display panel DP may be an organic light emitting display panel or a quantum dot light emitting display panel, for example. The organic light emitting display panel may include an organic light emitting material. A light emitting layer of the quantum dot light emitting display panel may include a quantum dot, a quantum rod, or the like. Hereinafter, the display panel DP may be described as the organic light emitting display panel.

Hereinafter, a case in which the display panel according to the invention is an organic light emitting display panel will be described. However, the technical idea of the invention is not limited thereto, and various display panels may be applied to the invention.

Referring to FIG. 3, the display panel DP includes a substrate SUB, a circuit element layer DP-CL disposed on the substrate SUB, a display element layer DP-OLED, and an insulation layer TFL.

The display panel DP includes a display area DP-DA and a non-display area DP-NDA. The display area DP-DA of the display panel DP may correspond to the display area DD-DA of FIG. 1 or the transmission area TA of FIG. 2, and the non-display area DP-NDA may correspond to the non-display area DD-NDA of FIG. 1 or the non-transmission area NTA of FIG. 2.

The substrate SUB may include at least one plastic film. The substrate SUB may include a plastic substrate, a glass substrate, a metal substrate, or an organic/inorganic composite substrate as a flexible substrate. The substrate SUB may include a synthetic resin film. The synthetic resin layer may include a thermosetting resin. The substrate SUB may have a multi-layered structure. In an embodiment, the substrate SUB may have a three-layered structure of a synthetic resin layer, an adhesive layer, and a synthetic resin layer, for example. Particularly, the synthetic resin layer may be a polyimide resin layer, and the material thereof is not particularly limited. In an embodiment, the synthetic resin layer may include at least one of an acrylic-based resin, a methacrylic-based resin, a polyisoprene-based resin, a vinyl-based resin, an epoxy-based resin, a urethane-based resin, a cellulose-based resin, a siloxane-based resin, a polyamide-based resin, or a perylene-based resin, for example. In addition, the substrate SUB may include a glass substrate, a metal substrate, and an organic/inorganic composite substrate.

The circuit element layer DP-CL includes at least one intermediate insulation layer and a circuit element. The intermediate insulation layer includes at least one intermediate inorganic film and at least one intermediate organic film. The circuit element includes signal lines, a driving circuit of a pixel, and the like. The circuit element layer DP-CL will be described below in more detail.

The display element layer DP-OLED may include a plurality of organic light emitting diodes. The display element layer DP-OLED may further include an organic layer such as a pixel defining layer. According to another embodiment, when the display panel is provided as a liquid crystal display panel, the display element layer may be provided as a liquid crystal layer.

The insulation layer TFL seals the display element layer DP-OLED. In an embodiment, the insulation layer TFL may be a thin film encapsulation layer, for example. The insulation layer TFL protects the display element layer DP-OLED against foreign substances such as moisture, oxygen, and dust particles. However, the invention is not limited thereto. In an embodiment, an encapsulation substrate may be provided instead of the insulation layer TFL, for example. In this case, the encapsulation substrate may be opposite to the substrate SUB, and the circuit element layer DP-CL and the display element layer DP-OLED may be disposed between the encapsulation substrate and the substrate SUB.

The input sensing layer ISU may be disposed between the window WM and the display panel DP. The input sensing layer ISU senses an input applied from the outside. The input applied from the outside may be provided in various manners. In an embodiment, the external input includes various types of external inputs such as a portion of user's body, a stylus pen, light, heat, a pressure, or the like. Also, an input through contact with the portion of the human body such as user's hands as well as adjacent or neighboring space touches (for example, hovering) may also be one form of the input.

The input sensing layer ISU may be directly disposed on the display panel DP. In this specification, that "a constituent A is directly disposed on a constituent B" may mean that an adhesive member is not disposed between the constituents A and B, but the constituents A and B contact each other. In this embodiment, the input sensing layer ISU and the display panel DP may be manufactured through a continuous process. However, the technical idea of the invention is not limited thereto. In an embodiment, the input sensing layer ISU may be provided as an individual panel and then be coupled to the display panel DP through an adhesive layer, for example. In another embodiment, the input sensing layer ISU may be omitted.

Referring back to FIG. 2, the electronic component DC may overlap the non-display area DP-NDA and be disposed on the display panel DP. According to the invention, the electronic component DC may be a driving chip that transfers a driving signal to the display panel DP. In an embodiment, the electronic component DC may generate a driving signal that is desired for the operation of the display panel DP on the basis of the control signal transmitted from the outside, for example. The electronic component DC may transmit the generated driving signal to the circuit element layer DP-CL of the display panel DP.

In an embodiment of the invention, the electronic component DC may be electrically connected to the display panel DP in an ultrasonic bonding manner. In an embodiment, a bump provided in the electronic component DC and a signal pad provided in the display panel DP may contact each other in the ultrasonic bonding manner, for example.

Figure 4:
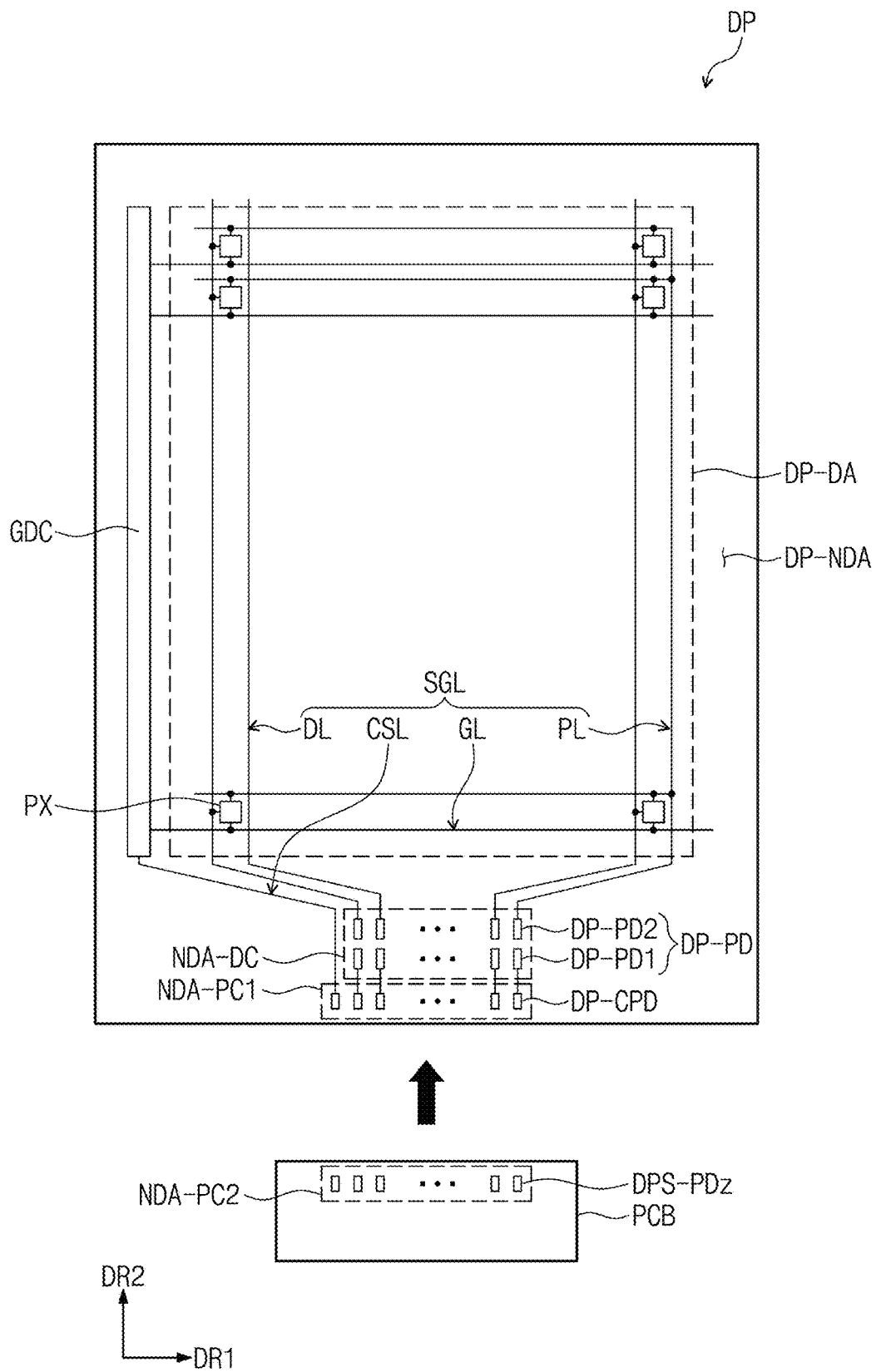
FIG. 4 is a plan view of an embodiment of the display panel according to the invention.
Figure 5A:
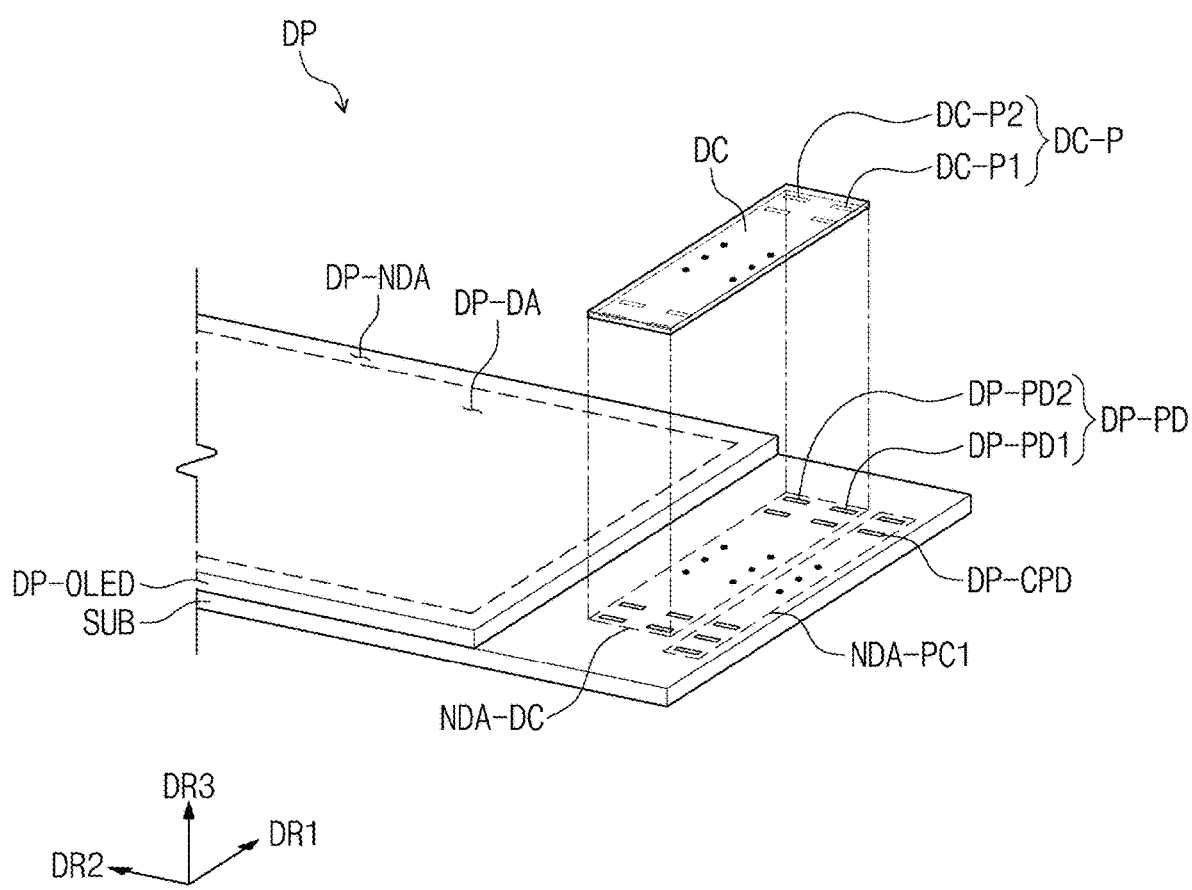
FIG. 5A is a perspective view illustrating an embodiment of a portion of the display device and an electronic component according to the invention.

FIG. 4 is a plan view of an embodiment of the display panel according to the invention. FIG. 5A is a perspective view illustrating an embodiment of a portion of the display device and the electronic component according to the invention.

Referring to FIG. 4, the display panel DP may include a driving circuit GDC, a plurality of signal lines SGL, a plurality of signal pads DP-PD, a plurality of connection signal pads DP-CPD, and a plurality of pixels PX (hereinafter, also referred to as pixels). The pixels PX are disposed on the display area DP-DA. Each of the pixels PX includes an organic light emitting diode and a pixel driving circuit connected to the organic light emitting diode. The driving circuit GDC, the signal lines SGL, the signal pads DP-PD, the connection signal pads DP-CPD, and the pixel driving circuit may be provided in the circuit element layer DP-CL illustrated in FIG. 3.

The driving circuit GDC sequentially outputs gate signals to the plurality of gate lines GL. The driving circuit GDC may further output other control signals to the pixels PX. In an embodiment, the driving circuit GDC may include a plurality of thin film transistors that are manufactured through the same process as that of the driving circuit of the pixel PX, e.g., a low temperature polycrystalline silicon ("LTPS") process or a low temperature polycrystalline oxide ("LTPO") process.

The signal lines SGL include gate lines GL, data lines DL, a power line PL, and a control signal line CSL. The gate lines GL are respectively connected to corresponding pixels of the pixels PX, and the data lines DL are respectively connected to corresponding pixels PX of the pixels PX. The power line PL is connected to the pixels PX. The control signal line CSL may provide control signals to the driving circuit GDC.

The signal lines SGL overlap the display area DP-DA and the non-display area DP-NDA. Each of the signal lines SGL may include a pad part and a line part. The line part overlaps the display area DP-DA and the non-display area DP-NDA. The pad part is connected to an end of the line part. The pad part is disposed on the non-display area DP-NDA to overlap a corresponding signal pad of the signal pads DP-PD.

Hereinafter, in this specification, an area of the non-display area DP-NDA, on which the signal pads DP-PD are disposed, may be defined as a chip area NDA-DC, and an area of the non-display area DP-NDA, on which the connection signal pads DP-CPD are disposed, may be defined as a first pad area NDA-PC1.

The signal pads DP-PD includes first row signal pads DP-PD1 arranged in a first row along the first direction DR1 and second row signal pads DP-PD2 arranged in a second row along the first direction DR1. However, the invention is not limited thereto. In an embodiment, the signal pads DP-PD may be arranged in one row along the first direction DR1, for example.

A portion of the circuit board PCB may be disposed on the first pad area NDA-PC1. The connection signal pads DP-CPD are electrically connected to the circuit board PCB to transmit the electrical signal received from the circuit board PCB to the signal pads DP-PD. In an embodiment, the connection signal pads DP-CPD may be connected to driving pads PB-PD of the second pad area NDA-PC2. The circuit board PCB may be rigid or flexible. In an embodiment, when the circuit board PCB is flexible, the circuit board PCB may be provided as a flexible printed circuit board, for example.

The circuit board PCB may include a timing control circuit that controls an operation of the display panel DP. Hereinafter, in this specification, the electronic component DC is described as a driving integrated circuit ("IC"). However, in an embodiment of the invention, the electronic component DC may be a circuit board PCB. The timing control circuit may be disposed (e.g., mounted) on the circuit board PCB in the form of an integrated chip. Also, although not shown, the circuit board PCB may include an input sensing circuit that controls the input sensing layer ISU.

The circuit board PCB may include driving pads PB-PD electrically connected to the display panel DP. The driving pads PB-PD may be disposed on the second pad area NDA-PC2 defined on the circuit board PCB.

Referring to FIG. 5A, in an embodiment, the electronic component DC illustrated in FIG. 2 may be disposed (e.g., mounted) on the chip region NDA-DC. The signal pads DP-PD are electrically connected to the electronic component DC to transmit the electrical signal received from the electronic component DC to the signal lines SGL. The signal pads DP-PD may be electrically connected to the corresponding driving pad parts DC-P, respectively. In an embodiment of the invention, the electronic component DC may be electrically connected to the display panel DP through the ultrasonic bonding method. In an embodiment, the driving pad part DC-P provided in the electronic component DC may be electrically connected to the signal pads DP-PD provided in the display panel DP by the ultrasonic bonding method, for example. In an embodiment, the driving pad part DC-P may include a first driving pad part DC-P1 corresponding to first row signal pads DP-PD1 and a second driving pad part DC-P2 corresponding to the second row signal pads DP-PD2. In the display panel DP of FIG. 5A, the circuit board PCB is omitted for convenience.

Figure 5B:
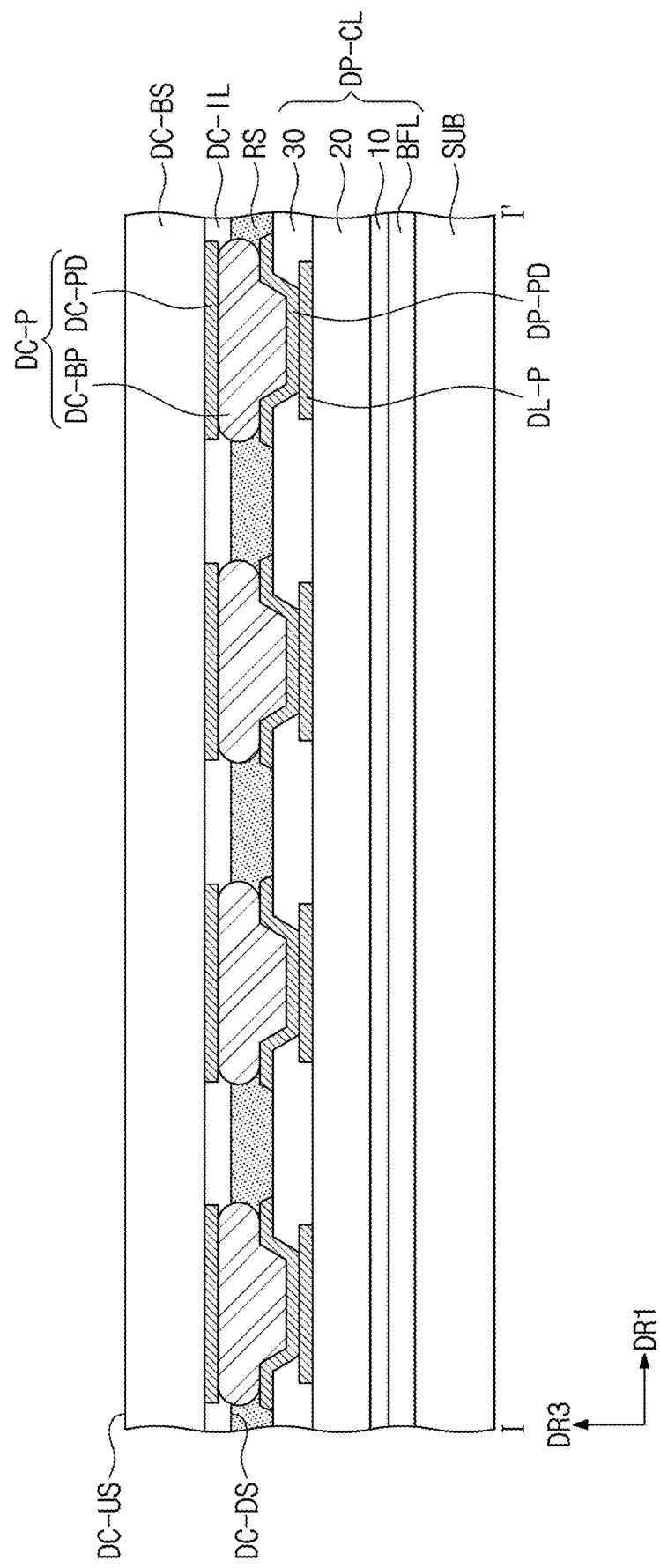
FIG. 5B is a cross-sectional view illustrating an embodiment of the portion of the display device and the electronic component according to the invention.

FIG. 5B is a cross-sectional view illustrating an embodiment of the portion of the display device and the electronic component according to the invention. FIG. 5B illustrates a portion of a cross-section taken along line I-I' of FIG. 2. Referring to FIG. 5B, the electronic component DC includes a base substrate DC-BS, a driving pad part DC-P, and a pad insulation layer DC-IL. The driving pad part DC-P includes a driving pad DC-PD and a bump DC-BP.

A top surface of the base substrate DC-BS may correspond to a top surface DC-US of the electronic component DC. A bottom surface of the pad insulation layer DC-IL facing the display panel DP may correspond to a bottom surface DC-DS of the electronic component DC. The base substrate DC-BS may include a silicon material.

The driving pad DC-PD may be disposed on a bottom surface of the base substrate DC-BS. The driving pad DC-PD may be electrically connected to a circuit element (not shown) of the electronic component DC. The pad insulation layer DC-IL may expose a portion of the driving pad DC-PD and may be disposed on the bottom surface of the base substrate DC-BS. In this case, a through-hole through which a portion of the driving pad DC-PD is exposed may be defined in the pad insulation layer DC-IL. In this specification, the pad insulation layer DC-IL may be omitted. The bump DC-BP may be disposed directly on the driving pad DC-PD.

Referring to FIG. 5B, the circuit element layer DP-CL may be disposed on a top surface of the substrate SUB. The circuit element layer DP-CL may include a buffer layer BFL and a plurality of insulation layers 10, 20, and 30. The buffer layer BFL may be an inorganic layer including an inorganic material. In an embodiment, the buffer layer BFL may include at least one of aluminum oxide, titanium oxide, silicon oxide silicon oxynitride, zirconium oxide, or hafnium oxide, for example. The buffer layer BFL may be provided as a multilayer. In an embodiment, the buffer layer BFL may be a layer in which a silicon oxide layer and a silicon nitride layer are alternately stacked, for example.

A plurality of insulation layers 10, 20, and 30 may be disposed on the buffer layer BFL. The first insulation layer 10, the second insulation layer 20, and the third insulation layer 30 may be sequentially stacked. Each of the plurality of insulation layers 10, 20, and 30 may be an inorganic layer and/or an organic layer and may have a single layer or a multi-layered structure. In an embodiment, each of the plurality of insulation layers 10, 20, and 30 may include at least one of aluminum oxide, titanium oxide, silicon oxide, silicon oxynitride, zirconium oxide, or hafnium oxide, for example.

The pad part DL-P may be disposed on the second insulation layer 20. The third insulation layer 30 may be disposed on the second insulation layer 20 and the pad part DL-P. The third insulation layer 30 may expose a portion of the pad part DL-P. That is, an opening through which the pad part DL-P is exposed may be defined in the third insulation layer 30. The signal pad DP-PD may be disposed on the pad part DL-P to contact the pad part DL-P. The signal pad DP-PD may be disposed on the pad part DL-P and the third insulation layer 30. The signal pad DP-PD may contact the pad part DL-P through the opening defined in the third insulation layer 30. Thus, the signal pad DP-PD may receive an electrical signal transmitted from the pad part DL-P or may transmit an electrical signal to the pad part DL-P.

In an embodiment of the invention, the bump DC-BP may contact the signal pad DP-PD by the ultrasonic bonding method. Thus, the bump DC-BP and the signal pad DP-PD may be electrically connected to each other.

When the bump DC-BP and the signal pad DP-PD are connected by a conductive adhesive member such as an anisotropic adhesive film, the adjacent signal pads DP-PD or the adjacent driving pads DC-PD may be electrically connected to each other by conductive particles. In an alternative embodiment, since the conductive particles are not disposed between the signal pad DP-PD and the driving pad DC-PD, the signal pad DP-PD and the driving pad DC-PD may not be electrically connected to each other. Since the bump DC-BP directly contacts the signal pad DP-PD by the ultrasonic bonding method, the above-described limitation may not occur.

The filler RS may be disposed between the electronic component DC and the substrate SUB. The filler RS may surround an outer surface of the ultrasonically bonded bump DC-BP and the signal pad DP-PD and be disposed between the electronic component DC and the substrate SUB. Since the filler RS is disposed between the electronic component DC and the display panel DP, the bumps DC-BP and the signal pads DP-PD may be blocked from the outside air. As a result, the bumps DC-BP and the signal pads DP-PD may be prevented from corrosion.

Figure 5C:
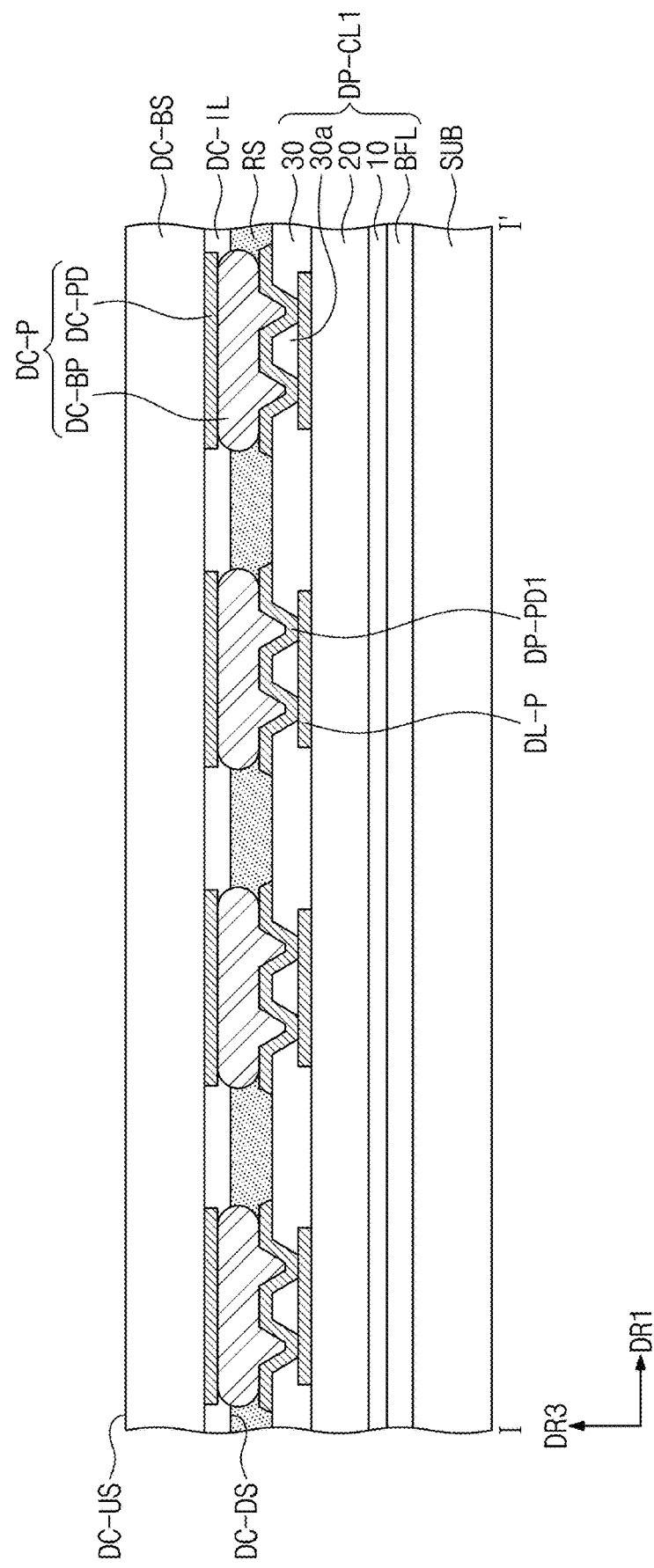
FIG. 5C is a cross-sectional view illustrating an embodiment of the portion of the display device and the electronic component according to the invention.

FIG. 5C is a cross-sectional view illustrating an embodiment of the portion of the display device and the electronic component according to the invention. FIG. 5C illustrates a cross-section corresponding to the cross-section of FIG. 5B.

Referring to FIG. 5C, the circuit element layer DP-CL may further include a protrusion 30a. The protrusion 30a may be disposed between the pad part DL-P and the signal pad DP-PD1. The protrusion 30a may be covered by the signal pad DP-PD1.

The protrusion 30a may be provided at the same time as the third insulation layer 30. The protrusion 30a may include the same material as that of the third insulation layer 30. However, the invention is not limited thereto, and thus, the protrusion 30a may be provided separately with respect to the third insulation layer 30 and may include a material different from that of the third insulation layer 30.

When the circuit element layer DP-CL further includes the protrusion 30a, a portion of the signal pad DP-PD1 overlapping the protrusion 30a protrudes. Thus, a surface area of the signal pad DP-PD1 may increase, and a contact area between the signal pad DP-PD1 and the bump DC-BP may increase. Also, when the signal pad DP-PD1 and the bump DC-BP are bonded to each other, a large pressure may be applied to the protruding portion of the signal pad DP-PD1. More particularly, when a pressure is applied for the ultrasonic bonding, the protruding portion of the signal pad DP-PD1 may have a pressure greater than that when the protrusion 30a is not provided. Thus, the signal pad DP-PD1 and the bump DC-BP may be more limitedly bonded to each other. Thus, durability of the display device DD may be improved.

In FIG. 5C, although only one protrusion 30a overlapping the signal pad DP-PD1 is illustrated, the invention is not limited thereto. In an embodiment, two or more protrusions 30a may be disposed. When the plurality of protrusions 30a is disposed, the protrusions 30a may be spaced apart from each other at regular intervals, for example. In an embodiment, a portion of the signal pad DP-PD1 overlapping with the protrusion 30a may be about ½ or less on the basis of the entire surface area of the signal pad DP-PD1. When the surface area of the signal pad DP-PD1 overlapping with the protrusion 30a exceeds about ½ of the total area of the signal pad DP-PD1, the contact area between the signal pad DP-PD1 and the pad part DL-P may not be sufficiently secured.

Hereinafter, the ultrasonic bonding method for the electronic component DC and the display panel DP is described in detail.

Figure 6A:
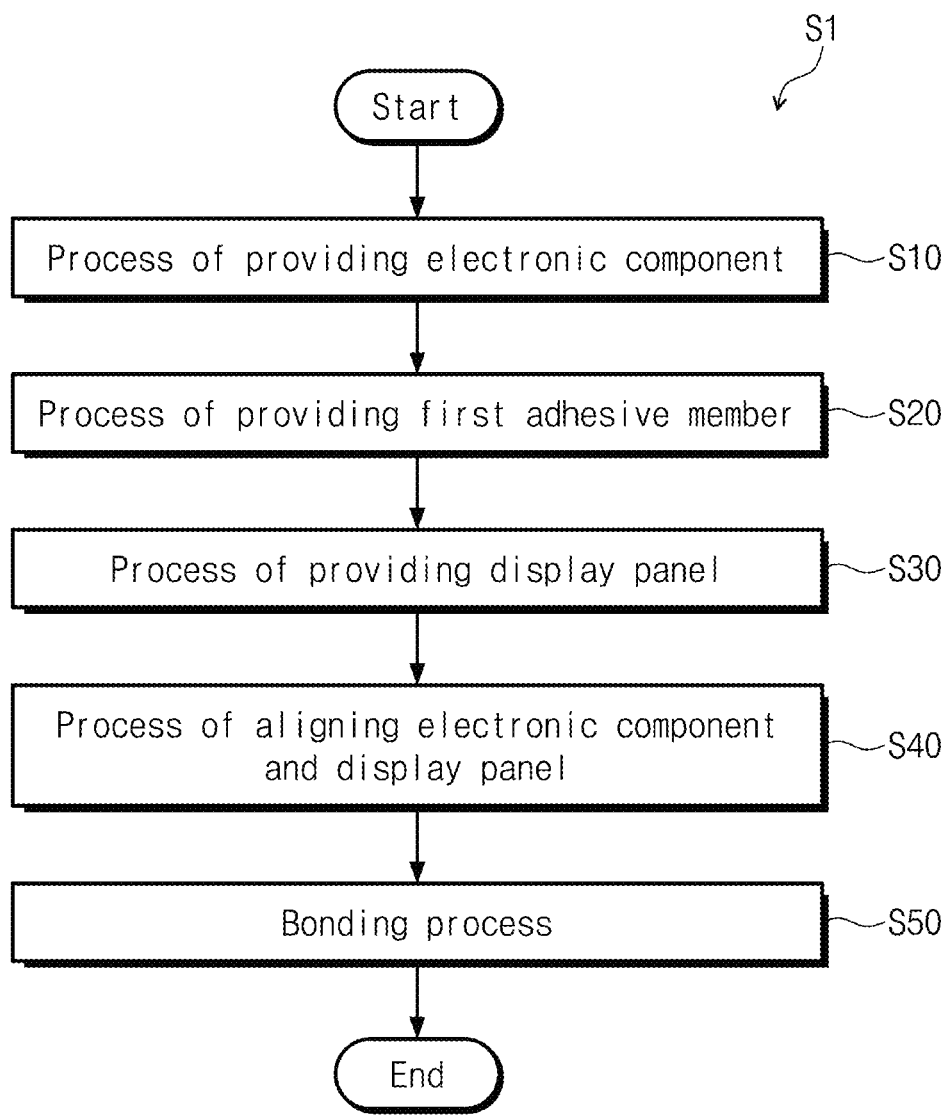
FIGS. 6A to 6C are schematic views illustrating an embodiment of a method for manufacturing a display device according to the invention.
Figure 6B:
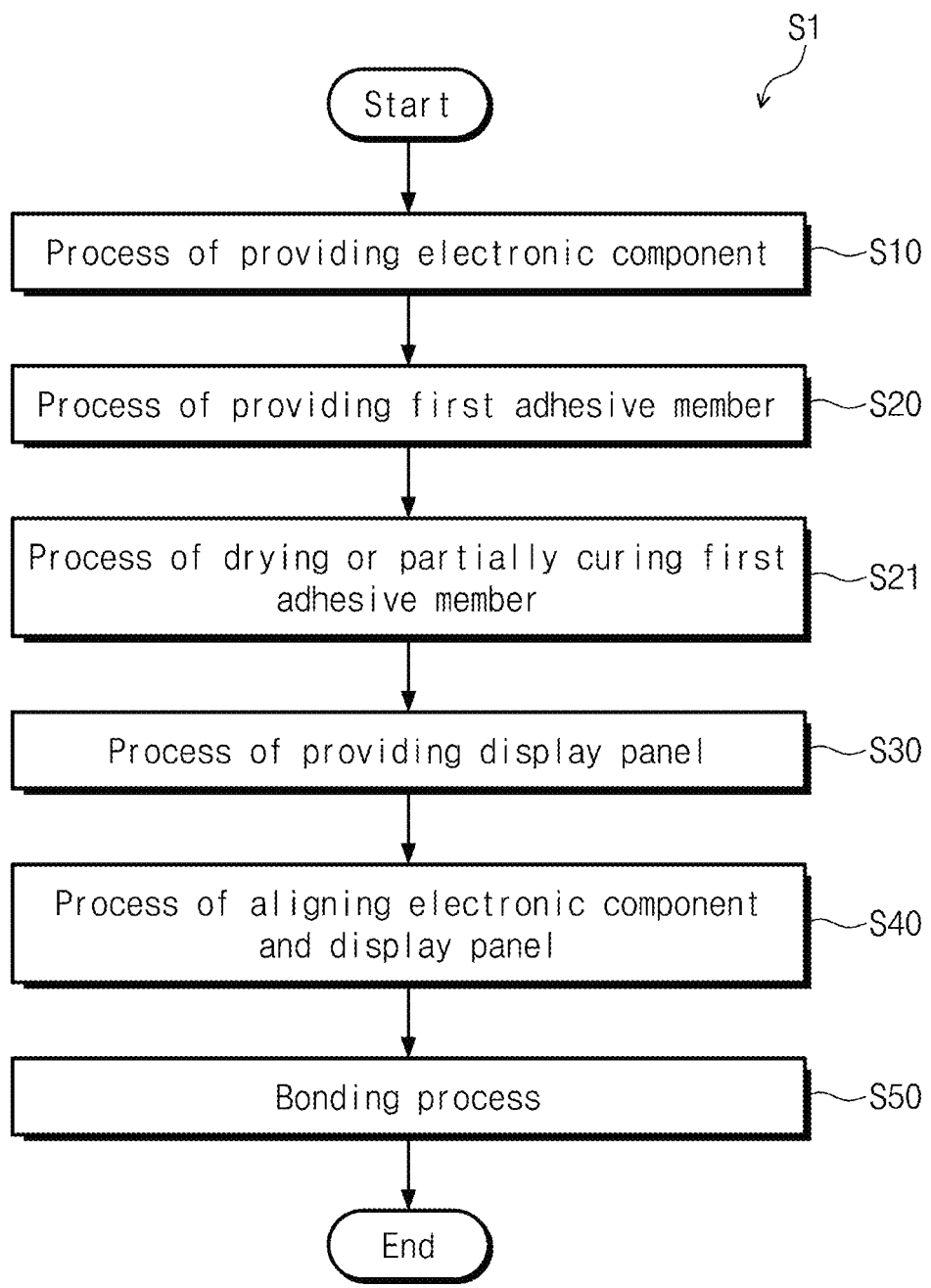
Figure 6C:
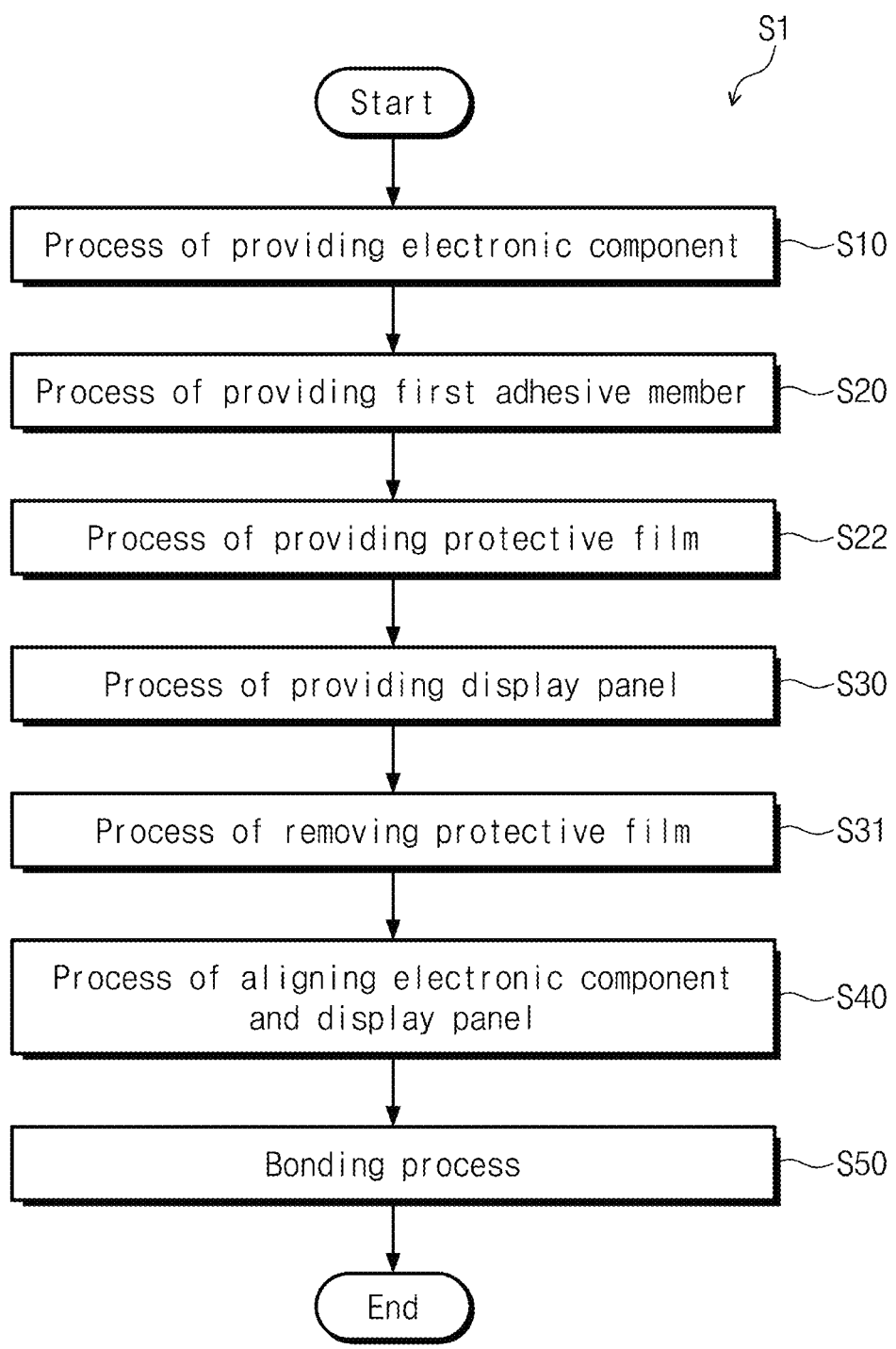

FIGS. 6A to 6C are schematic views illustrating an embodiment of a method for manufacturing a display device according to the invention.

FIGS. 6A to 6C do not specify an order of a method (S1) for manufacturing a display device DD. In FIGS. 6A to 6C, the order of respective processes may be changed.

Referring to FIG. 6A, the method (S1) for manufacturing the display device DD in an embodiment may include a process (S10) of providing an electronic component DC, a process (S20) of providing a first adhesive member RS1-P, a process (S30) of providing a display panel DP, a process (S40) of aligning an electronic component DC and a display panel DP, and a bonding process (S50).

Referring to FIG. 6B, the method (S1) for manufacturing the display device DD in an embodiment may further include a process (S21) of drying or partially curing the first adhesive members RS1-P (refer to FIG. 7A). The process (S21) of drying or partially curing the first adhesive member RS1-P may be performed among the process (S20) of providing the first adhesive member RS1-P, the process (S40) of aligning the electronic component DC and the display panel DP, and the bonding process (S50).

Referring to FIG. 6C, the method (S1) for manufacturing the display device may further include a process (S22) of providing a protective film PF (refer to FIG. 7C) and a process (S31) of removing the protective film PF. The process (S22) of providing the protective film PF may be performed between the process (S20) of providing the first adhesive member and the process (S40) of aligning the electronic component DC and the display panel DP. In an embodiment, the process (S22) of providing the protective film PF may be performed after the process (S21) of drying or partially curing the first adhesive member RS1-P. The process (S31) of removing the protective film PF may be performed after the process (S30) of providing the display panel DP, for example.

FIGS. 7A to 7G are cross-sectional views illustrating each process in FIGS. 6A to 6C. In FIGS. 7A to 7G, a cross-section of the electronic component DC and the display panel DP represents an area corresponding to the cross-section of FIG. 5B.

FIG. 7A is a cross-sectional view illustrating the process (S10) of providing the electronic component DC and the process (S20) of providing the first adhesive member RS1-P. Referring to FIG. 7A, the first adhesive member RS1-P may be provided between the plurality of bumps DC-BP. Each of the bumps DC-BP may include a bottom surface contacting the driving pad DC-PD and a top surface facing the bottom surface.

The first adhesive members RS1-P may not cover the bumps DC-BP. More particularly, at least a portion of the top surface of each of the bumps DC-BP may be exposed between the first adhesive members RS1-P. In an embodiment, a top surface of each of the bumps DC-BP may be completely exposed between the first adhesive members RS1-P. That is, the first adhesive member RS1-P may be disposed between the bumps DC-BP so as not to contact the top surface of each of the bumps DC-BP or so as to contact a portion (for example, an edge portion) of the top surface of each of the bumps DC-BP.

At least a portion of each of the bumps DC-BP may non-overlap the first adhesive member RS1-P in a plan view. In an embodiment, each of the bumps DC-BP may completely non-overlap the first adhesive member RS1-P in the plan view.

In a case that the first adhesive member RS1-P covers the bumps DC-BP, when bump DC-BP and the signal pad DP-PD are bonded to each other, the first adhesive member RS1-P may remain on the bonding surface between the bump DC-BP and the signal pad DP-PD. In this case, conductivity between the bump DC-BP and the signal pad DP-PD may be deteriorated.

In an embodiment of the method (S1) for manufacturing the display device, the first adhesive members RS1-P does not cover the bumps DC-BP. Thus, when the bump DC-BP and the signal pad DP-PD are bonded to each other, the first adhesive member RS1-P may be prevented from remaining on the bonding surface of the bump DC-BP and the signal pad DP-PD, or the remaining of the first adhesive member RS1-P may be minimized. Thus, in an embodiment, the conductivity between the bump DC-BP and the signal pad DP-PD may be improved. As a result, the signal may be smoothly transmitted between the electronic component DC and the display panel DP.

Referring to FIG. 7A, the first adhesive members RS1-P may protrude between the bumps DC-BP. However, the invention is not limited thereto, and the first adhesive member RS1-P may not protrude between the bumps DC-BP. That is, the first adhesive members RS1-P may be disposed at the same position as that of the top surfaces of the bumps DC-BP or at a position lower than that of the top surfaces of the bumps DC-BP in a normal direction (third direction DR3). When the first adhesive member RS1-P is provided so as not to protrude between the bumps DC-BP, the second adhesive member RS2-P may be provided on the display panel DP, and this will be described below in detail.

Referring to FIG. 7A, the first adhesive member RS1-P is illustrated as being in contact with the edge portion of the top surface of each of the bumps DC-BP. However, even when the first adhesive member RS1-P is disposed to protrude between the bumps DC-BP, the first adhesive member RS1-P may be disposed so as not to contact the edge portion of the top surface of each of the bumps DC-BP according to a protruding height of the first adhesive member RS1-P or physical properties (for example, surface energy) of the first adhesive member RS1-P.

FIG. 7B is a cross-sectional view illustrating the process (S21) of drying or partially curing the first adhesive member RS1-P.

The first adhesive members RS1-P may include a thermal initiator. In this case, heat may be applied to the first adhesive members RS1-P to cure the first adhesive members RS1-P.

The kind of first adhesive member RS1-P is not specifically limited. In an embodiment, the first adhesive member RS1-P may include at least one of an epoxy monomer, an acrylic monomer, a urethane monomer, an olefin monomer, an amide monomer, an imide monomer, a siloxane monomer, or a polyol monomer, for example. The first adhesive members RS1-P may include oligomers. The monomers and oligomers described above may be monofunctional groups or polyfunctional groups. In an embodiment, the first adhesive member RS1-P may include any one of the epoxy monomer and the acrylic monomer, for example.

In an embodiment, the first adhesive member RS1-P may be dried or partially cured to form a dried or partially cured first adhesive member RS1-D. Thus, when the electronic component DC and the display panel DP are bonded to each other, the first adhesive members RS1-P may be prevented from flowing. Also, in the case in which the first adhesive member RS1-P is partially cured, a curing time may be reduced rather than that for which it takes completely cure the first adhesive member RS1-P.

Figure 7C:
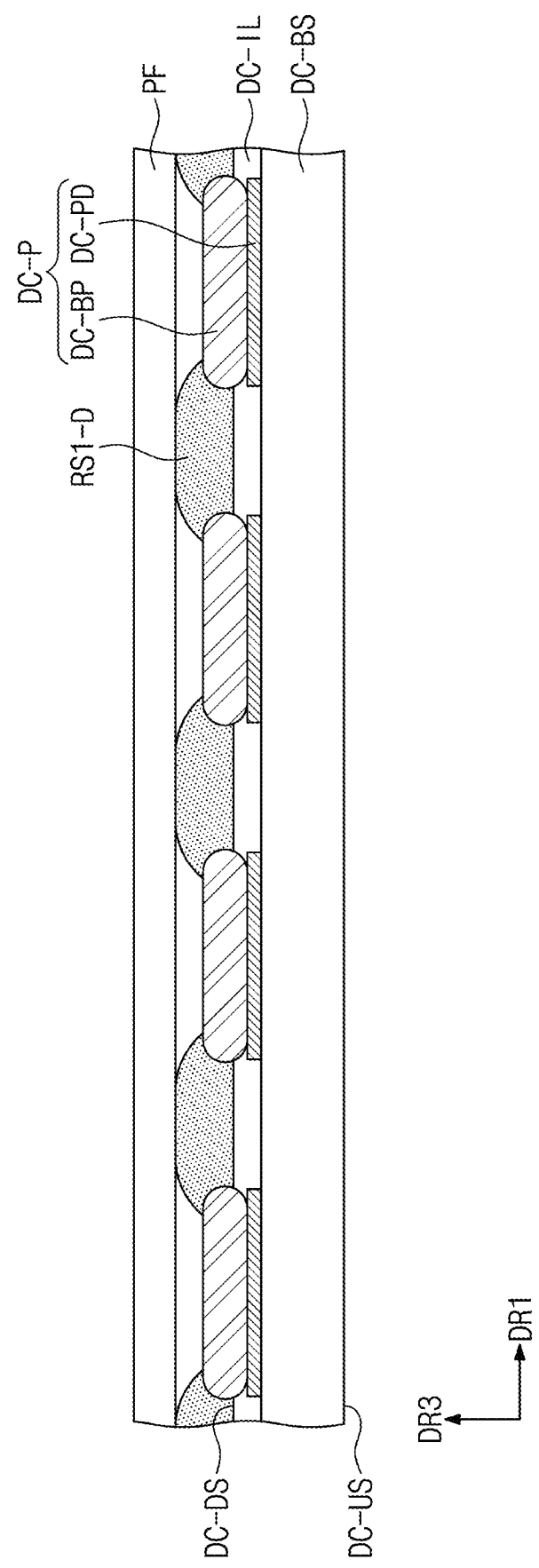

FIG. 7C is a cross-sectional view illustrating the process (S22) of providing the protective film PF. In an embodiment, the protective film PF may be provided on the electronic component DC. The protective film PF may be provided after the first adhesive member RS1-P is dried or partially cured.

In an embodiment, the protective film PF is not particularly limited but may be a plastic film. In an alternative embodiment, the protective film PF may be a paper film including cellulose. The protective film PF may be a release paper having one surface having adhesiveness and the other surface having no adhesiveness. The adhesive surface on the protective film PF may be disposed on the electronic component DC. The protective film PF may be disposed on the electronic component DC to prevent the electronic component DC from being damaged when the electronic component DC is transported. In FIG. 7C, the protective film PF contacts the dried or partially cured first adhesive member RS1-D. However, when the first adhesive member RS1-P does not protrude between the bumps DC-BP, the protective film PF may contact the bumps DC-BP.

As described above, in an embodiment of the method (S1) for manufacturing the display device DD, the process (S31) of removing the protective film PF may be performed before the process (S40) of aligning the display panel DP.

Figure 7D:
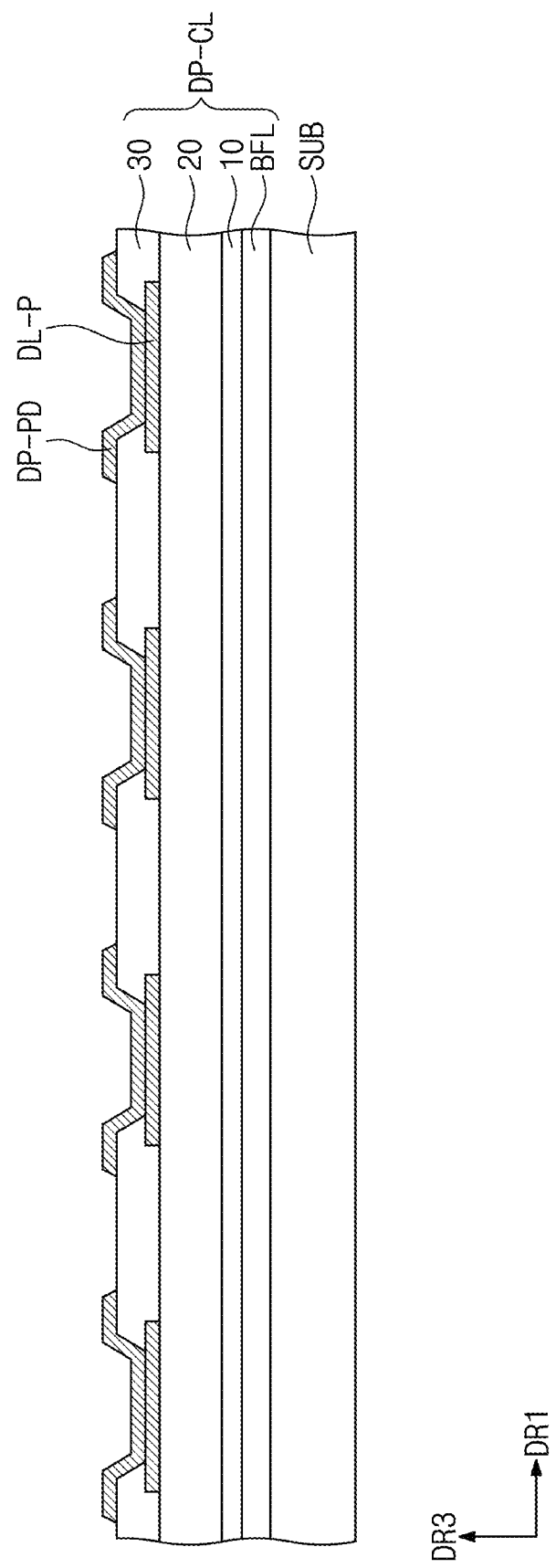
Figure 7E:
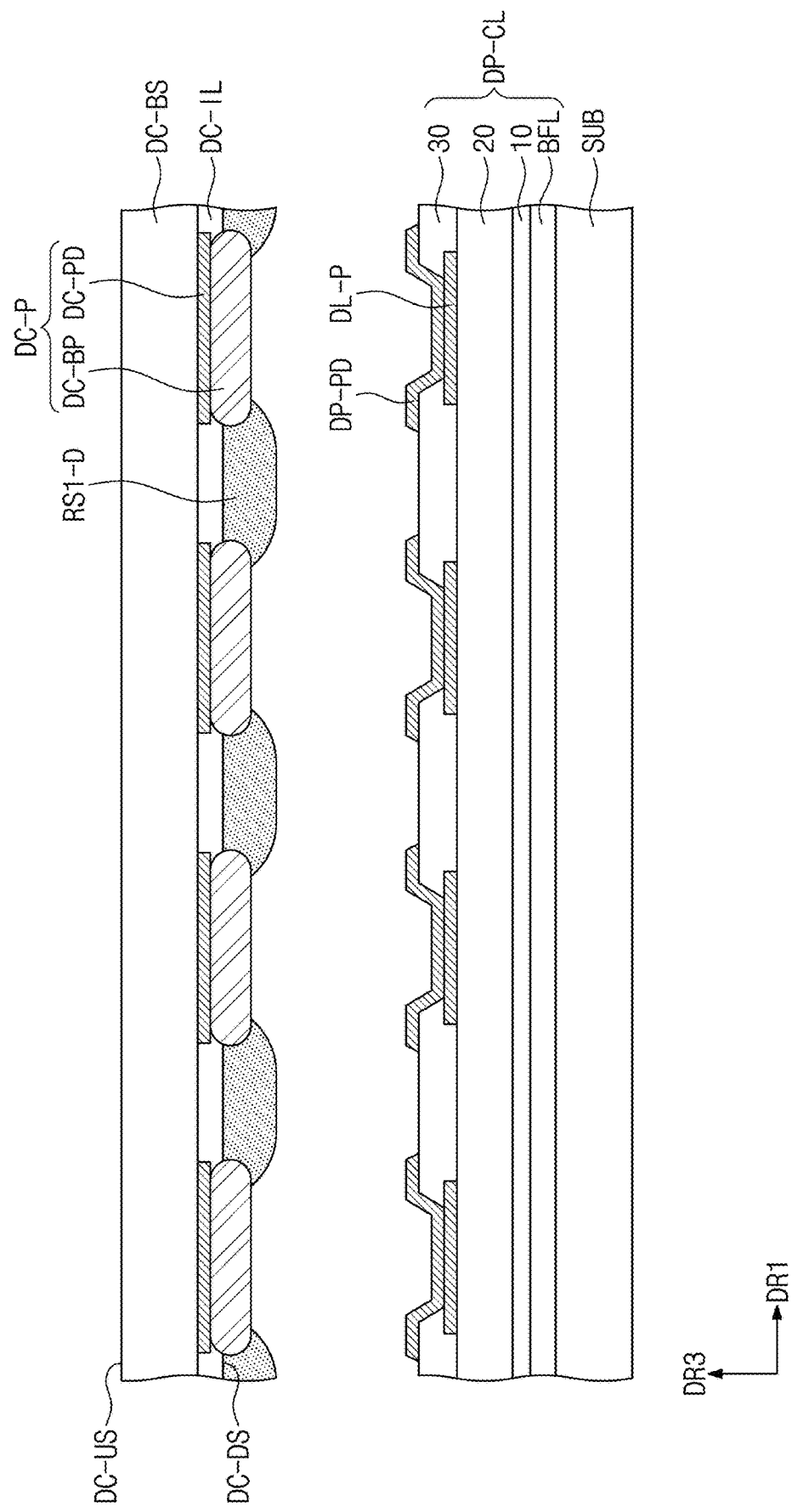

FIG. 7D is a cross-sectional view illustrating the process (S30) of providing the display panel DP. FIG. 7E is a cross-sectional view illustrating the process (S40) of aligning the electronic component DC and the display panel DP. Referring to FIGS. 7D and 7E, in an embodiment, a separate adhesive member may not be provided on the display panel DP. As illustrated in FIG. 7A, since the first adhesive member RS1-P may be provided to protrude between the bumps DC-BP, even though the adhesive member is not provided on the display panel DP, the portion between the electronic component DC and the display panel DP may be filled without an empty therebetween.

Referring to FIG. 7E, in an embodiment, the electronic component DC (refer to FIG. 5A) may be aligned on the upper portion of the display panel DP (refer to FIG. 5A). However, the invention is not limited thereto, and the display panel DP may be arranged on the upper portion of the electronic component DC.

In the process (S40) of aligning the electronic component DC and the display panel DP, the electronic component DC and the display panel DP may be aligned so that the bumps DC-BP and the signal pads DP-PD are aligned to respectively correspond to each other.

Figure 7F:
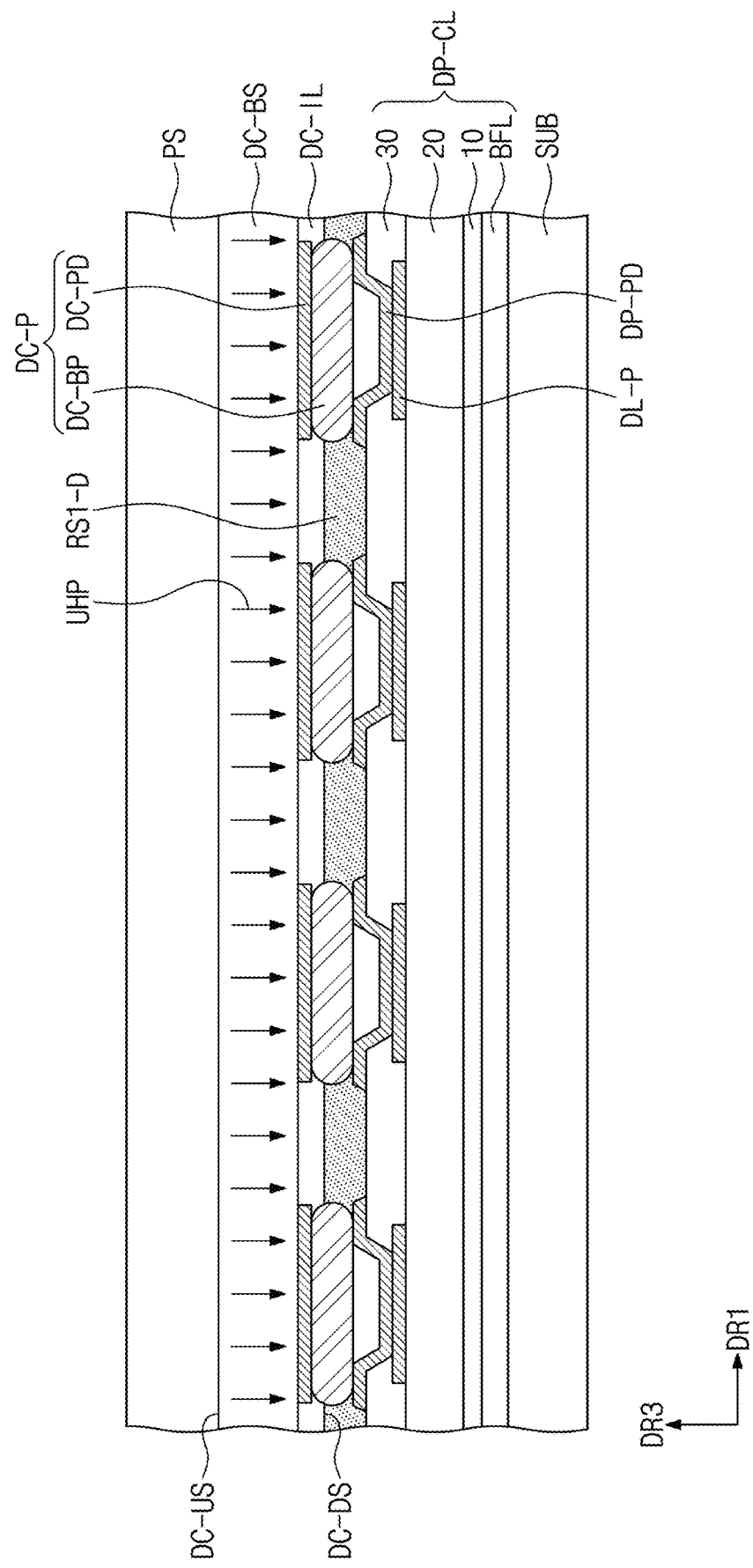
Figure 7G:
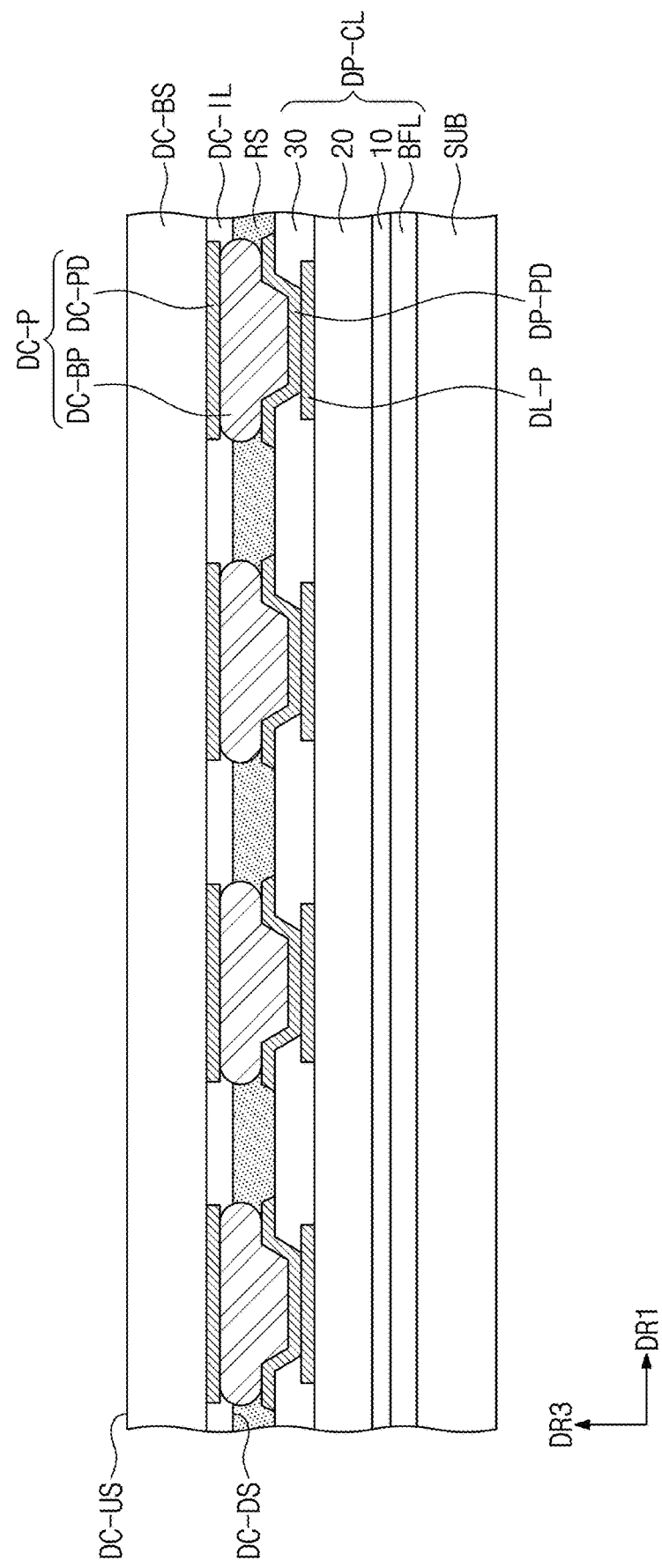

FIG. 7F is a cross-sectional view illustrating the process (S50). Referring to FIG. 7F, ultrasonic waves, a pressure, and heat UHP may be applied to the corresponding bumps DC-BP and signal pads DP-PD. In an embodiment, the ultrasonic waves, the pressure, and the heat UHP may be provided from a separate external force applying member PS. In an embodiment, the heat of the ultrasonic waves, the pressure, and the heat UHP may not be applied.

In FIG. 7F, the external force applying member PS is disposed on the electronic component DC to provide the ultrasonic waves, the pressure, and the heat UHP to the bump DC-BP and the signal pad DP-PD. However, the invention is not limited thereto. In an embodiment, the external force applying member PS may be disposed on the display panel DP to provide the ultrasonic waves, the pressure, and the heat UHP to the bump DC-BP and the signal pad DP-PD.

When the ultrasonic vibration and pressure are applied to an interface between the bump DC-BP and the signal pad DP-PD, frictional heat is generated at the interface between the bump DC-BP and the signal pad DP-PD. Accordingly, the interface between the bump DC-BP and the signal pad DP-PD may react with each other by the frictional heat. As a result, the bump DC-BP and the signal pad DP-PD may adhere to each other. In addition, as the heat is applied to the top surface of the base substrate DC-BS, the bump DC-BP and the signal pad DP-PD may adhere more quickly to each other.

In an embodiment, each of the bump DC-BP and the driving pad part DC-P may include a conductive material. Each of the bump DC-BP and the driving pad part DC-P may include a conductive metal. In an embodiment, the bump DC-BP may include gold (Au), for example. Since the gold has low hardness, the gold may easily react with the metal included in the signal pad DP-PD when the ultrasonic waves, the pressure, and the heat UHP are applied. Thus, the gold of the bump DC-BP and the metal of the signal pad DP-PD react with each other to cause a diffusion phenomenon, and the bump DC-BP and the signal pad DP-PD may be bonded to each other.

In the bonding process (S50), the heat may be applied to the dried or partially cured first adhesive members RS1-D. When the process (S21) of drying or partially curing the first adhesive members RS1-P is omitted, the heat may be applied to the first adhesive members RS1-P. The first adhesive member RS1-P may be a thermosetting adhesive member including a thermal initiator. Therefore, when the heat is applied to the first adhesive members RS1-P in the bonding process (S50), the first adhesive members RS1-P may be completely cured to form the filler RS.

In an embodiment, when the adhesive member is filled in the space between the electronic component DC and the display panel DP after bonding the electronic component DC to the display panel DP, the process time may increase. In an embodiment, the adhesive member is applied before the bonding of the electronic component DC and the display panel DP. Therefore, the process time may be saved. Also, when the partial curing process is performed, a curing time of the adhesive member may be reduced, and the process time may be further reduced.

Figure 8:
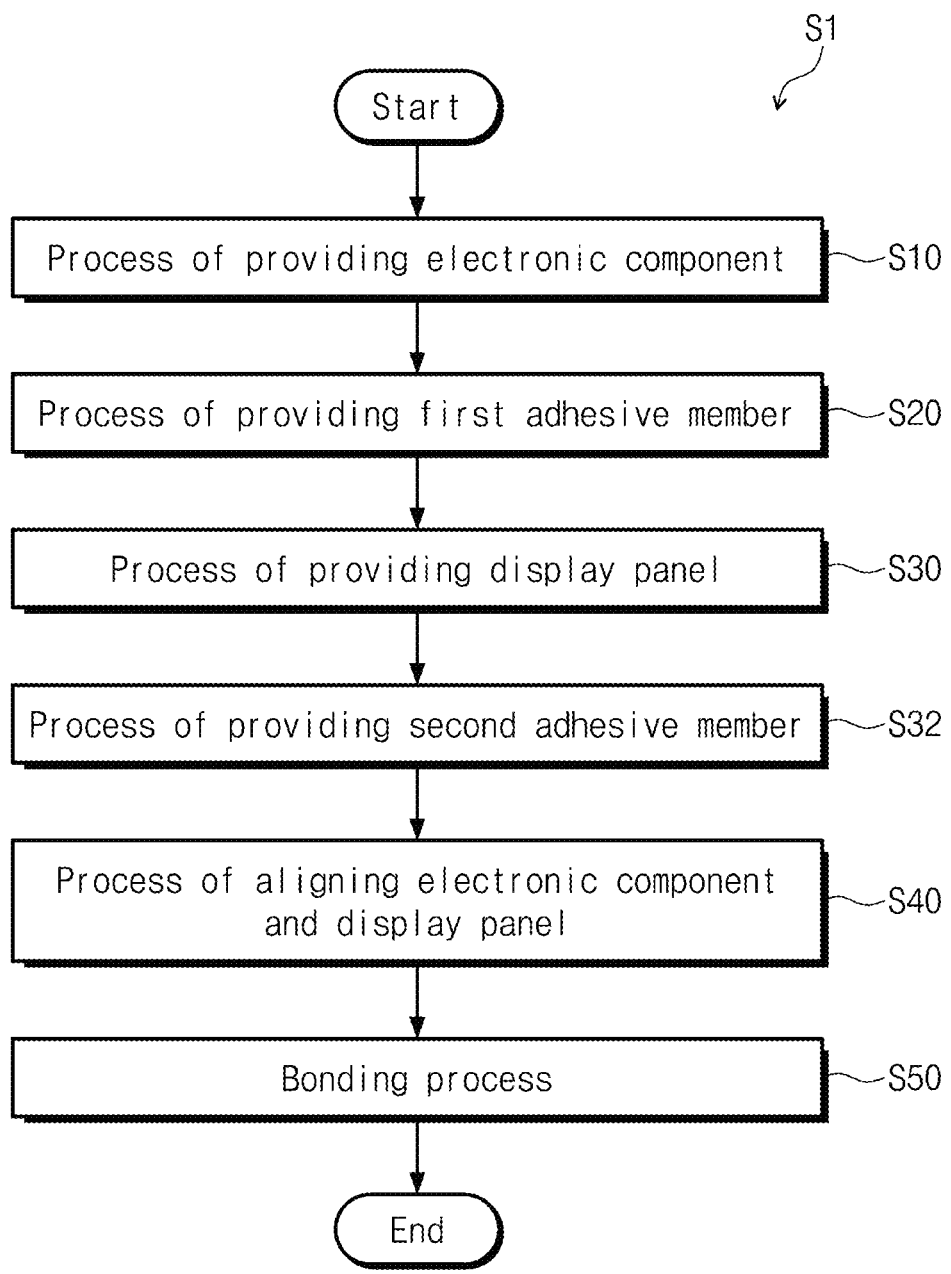
FIG. 8 is a schematic view illustrating an embodiment of a method for manufacturing a display device according to the invention.

FIG. 8 is a schematic view illustrating an embodiment of a method for manufacturing the display device according to the invention. Referring to FIG. 8, the method (S1) for manufacturing the display device DD in an embodiment may further include a process (S32) of providing a second adhesive member RS2-P. In FIG. 8, an order of the process (S32) of providing the second adhesive member RS2-P is not specified. The process (S32) of providing the second adhesive member RS2-P may be performed in any process before the step S40 of aligning the electronic component DC and the display panel DP.

Figure 9A:
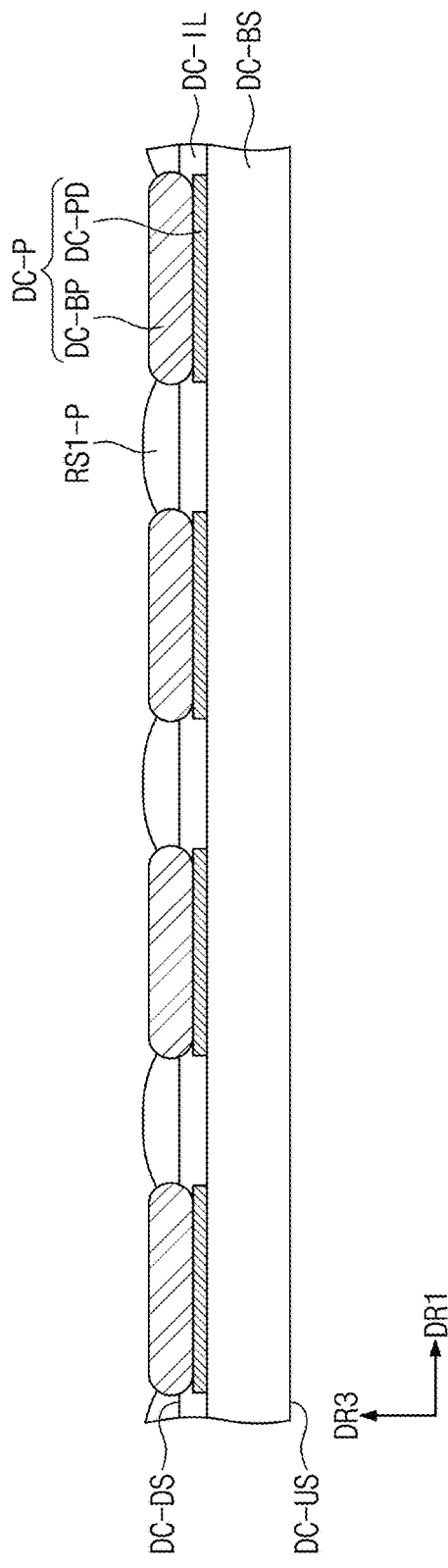
FIGS. 9A to 9C are cross-sectional views illustrating respective processes in FIG. 8.
Figure 9B:
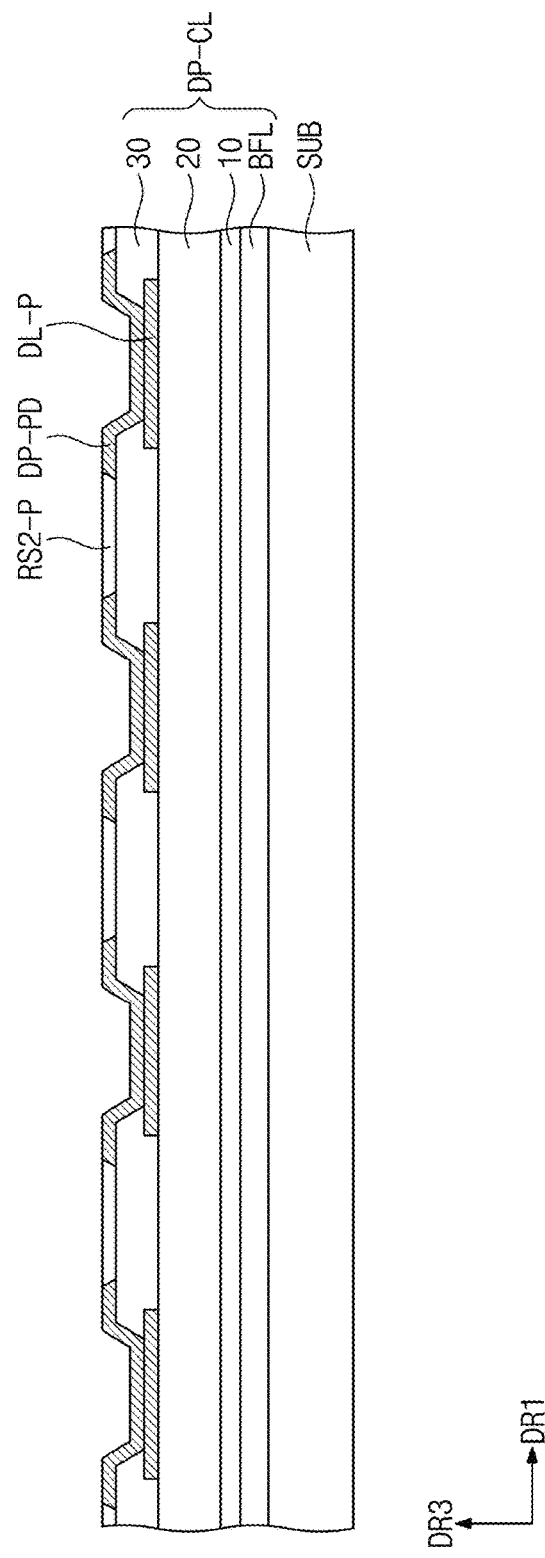
Figure 9C:
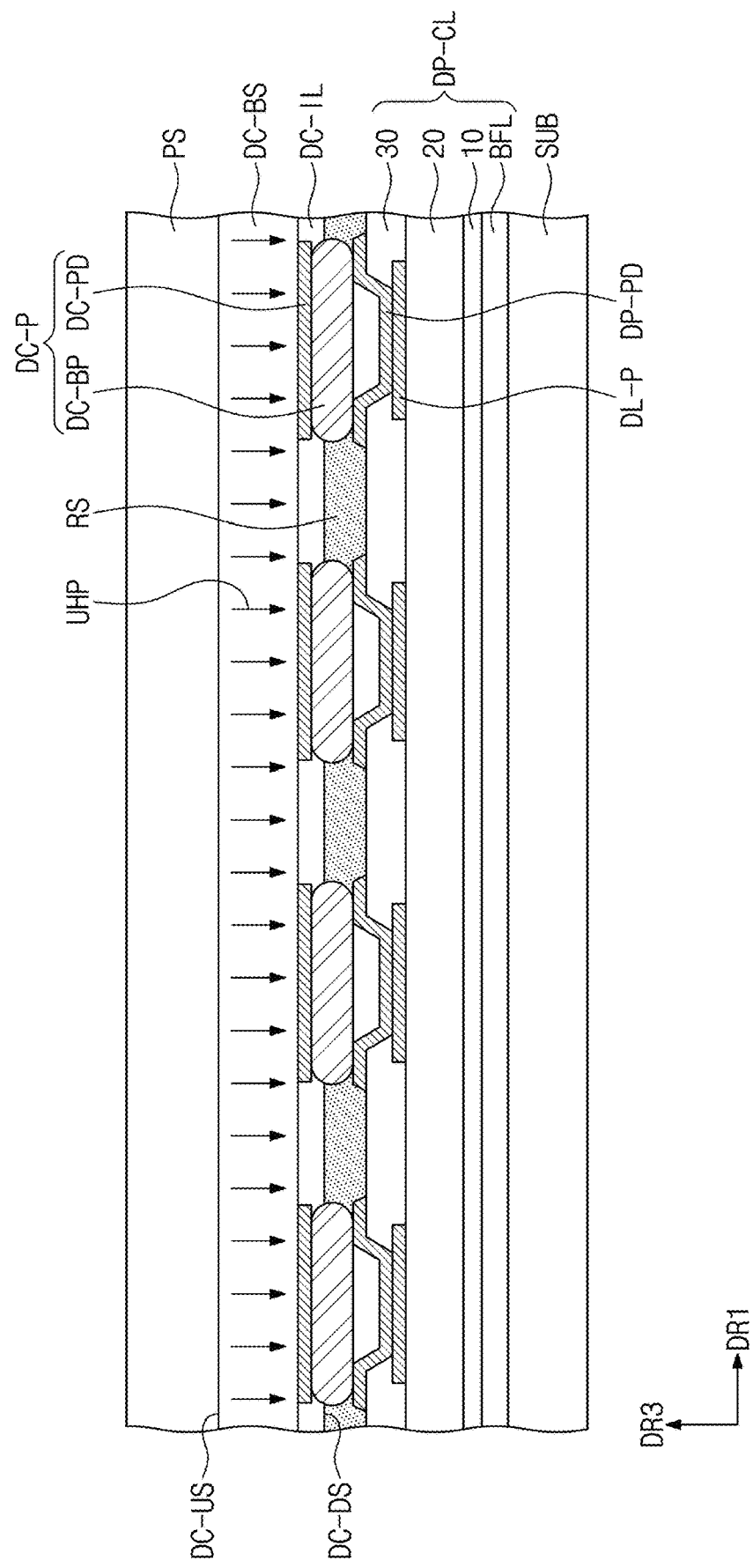
Figure 10A:
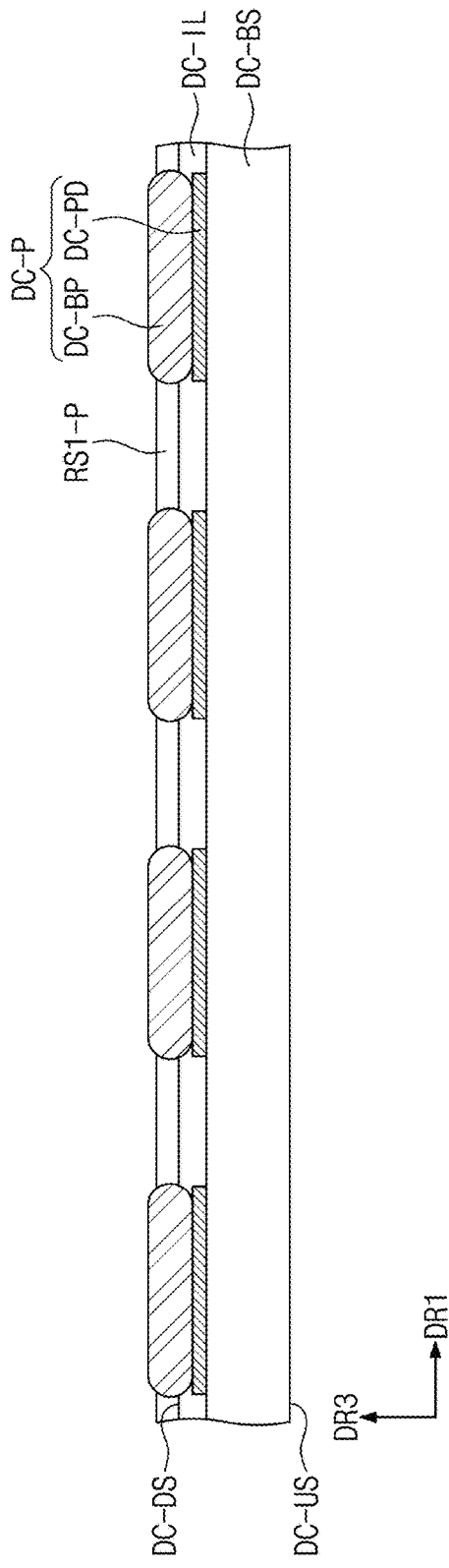
FIGS. 10A to 10C are cross-sectional views illustrating respective processes in FIG. 8.
Figure 10B:
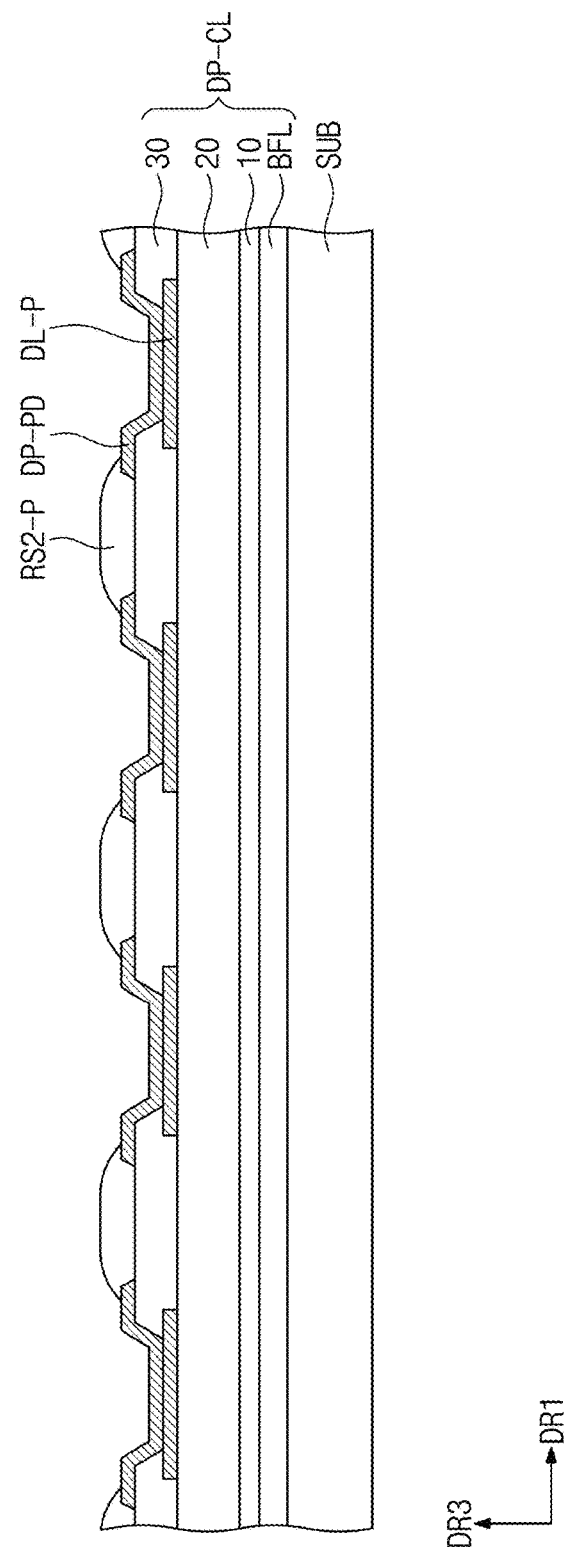
Figure 10C:
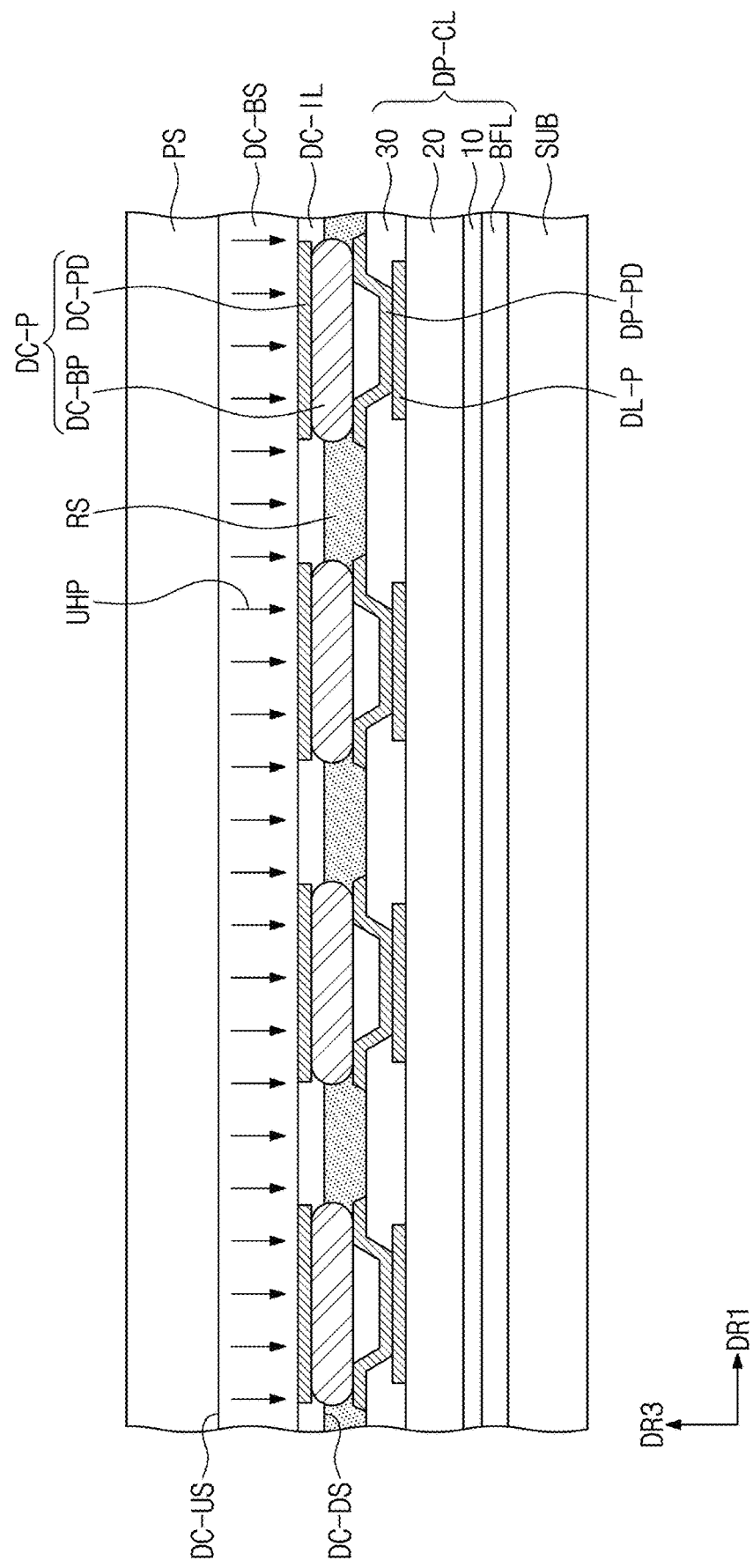

FIGS. 9A to 9C are cross-sectional views illustrating respective processes in FIG. 8. FIGS. 10A to 10C are cross-sectional views illustrating respective processes in FIG. 8. In FIGS. 9A to 9C and FIGS. 10A to 10C, a cross-section of the electronic component DC and the display panel DP represents an area corresponding to the cross-section of FIG. 5B. Hereinafter, unless otherwise stated, the same description as described above may be applied to respective processes of the method (S1) for manufacturing the display device.

FIGS. 9A and 10A are cross-sectional views illustrating the process (S20) of providing the first adhesive member RS1-P.

Referring to FIG. 9A, the first adhesive members RS1-P may be disposed at substantially the same height as the position of the top surface of the bumps DC-BP in a normal direction (third direction DR3). The first adhesive members RS1-P may be flat between the bumps DC-BP, but the invention is not limited thereto. In an embodiment, the top surface of the first adhesive member RS1-P may have a convex shape or a concave shape according to a surface energy difference between the first adhesive member RS1-P and the bump DC-BP, for example. Even in a case that the top surface of the first adhesive member RS1-P has the convex or concave shape, when a mean thickness of the first adhesive member RS1-P is equal to a distance between the top surface of the pad insulation layer DC-IL and the top surface of the signal pad DP-PD, the first adhesive member RS1-P may be interpreted to be disposed at a position having substantially the same position as the top surface of each of the bumps DC-BP in the normal direction (the third direction DR3).

Referring to FIG. 10A, the first adhesive members RS1-P may be disposed at a position lower than that of each of the bumps DC-BP in the normal direction (third direction DR3).

FIGS. 9B and 10B are cross-sectional views illustrating the process (S32) of providing a second adhesive member. Referring to FIG. 9B, the second adhesive member RS2-P may be provided between the signal pads DP-PD. Each of the signal pads DP-PD may include a bottom surface contacting the pad part DL-P and a top surface facing the bottom surface.

Hereinafter, the same descriptions as those of the above-described first adhesive members RS1-P may be applied to parts that are not separately described with respect to the second adhesive members RS2-P.

The second adhesive member RS2-P may not cover the signal pads DP-PD. More particularly, at least a portion of the top surface of each of the signal pads DP-PD may be exposed between the second adhesive members RS2-P. In an embodiment, a top surface of each of the signal pads DP-PD may be completely exposed between the second adhesive members RS2-P. That is, the second adhesive member RS2-P may be disposed between the signal pads DP-PD so as not to contact the top surface of each of the signal pads DP-PD or so as to contact a portion (for example, an edge portion) of the top surface of each of the signal pads DP-PD.

At least a portion of each of the signal pads DP-PD may non-overlap the second adhesive member RS2-P in a plan view. In an embodiment, each of the signal pads DP-PD may completely non-overlap the second adhesive member RS2-P in the plan view.

Referring to FIGS. 9B and 10B, the second adhesive member RS2-P may protrude or not protrude between the signal pads DP-PD.

In a case that the second adhesive member RS2-P covers the signal pads DP-PD, when the bump DC-BP and the signal pad DP-PD are bonded to each other, the second adhesive member RS2-P may remain on the bonding surfaces between the bump DC-BP and the signal pads DP-PD. In this case, conductivity between the bump DC-BP and the signal pad DP-PD may be deteriorated.

In an embodiment of the method (S1) for manufacturing the display device, the second adhesive member RS2-P does not cover the signal pads DP-PD. Thus, when the bump DC-BP and the signal pads DP-PD are bonded to each other, the second adhesive member RS2-P may be prevented from remaining on the bonding surface of the bump DC-BP and the pad part DL-P, or the remaining of the first adhesive member RS1-P may be minimized. Thus, in an embodiment, the conductivity between the bump DC-BP and the signal pad DP-PD may be improved. As a result, the signal may be smoothly transmitted between the electronic component DC and the display panel DP.

Referring to FIG. 9B, the second adhesive member RS2-P may be disposed up to a position having substantially the same height as the position of the top surfaces of the signal pads DP-PD in the normal direction (the third direction DR3). Referring to FIG. 10B, the second adhesion member RS2-P may be disposed up to a position having a height higher than that of the top surface of each of the signal pads DP-PD in the normal direction (the third direction DR3).

In an embodiment, the second adhesive member RS2-P may be the same adhesive member as the first adhesive member RS1-P. In an embodiment, the second adhesive member RS2-P may be a thermosetting adhesive member including a thermosetting agent, for example.

In an embodiment, any one of the first adhesive member RS1-P and the second adhesive member RS2-P may include a main material, and the other one may be a curing agent that curing-reacts with the main material. That is, the first adhesive member RS1-P and the second adhesive member RS2-P may be two-component adhesive members that meet each other to cause curing reaction. In an embodiment, the thickness of each of the bumps DC-BP may be greater than that of each of the signal pads DP-PD. Thus, more amount of the first adhesive members RS1-P than the second adhesive members RS2-P may be disposed. Here, the first adhesive member RS1-P may be the main material, and the second adhesive member RS2-P may be the curing agent. Although not particularly limited, the main material or the curing agent may include at least one of an epoxy monomer or an acrylic monomer.

FIGS. 9C and 10C are cross-sectional views illustrating the bonding process (S50).

Referring to FIGS. 9C and 10C, the ultrasonic waves, the pressure, and the heat UHP may be applied to the first adhesive members RS1-P and the second adhesive members RS2-P. When each of the first adhesive member RS1-P and the second adhesive member RS2-P are a thermosetting adhesive member, the first adhesive member RS1-P and the second adhesive member RS2-P may be cured through the heat applied to the first adhesive member RS1-P and the second adhesive member RS2-P to form the filler RS (refer to FIG. 5B).

In an embodiment, the heat may not be applied. Particularly, when any one of the first adhesive member RS1-P and the second adhesive member RS2-P is a main material, and the other one is a curing agent, the heat may not be applied. The first adhesive member RS1-P and the second adhesive member RS2-P may be mixed with each other by the ultrasonic vibration and the pressure. Therefore, the first adhesive member RS1-P and the second adhesive member RS2-P may be cured to form the filler RS (refer to FIG. 5B). In an embodiment, when any one of the first adhesive member RS1-P and the second adhesive member RS2-P is the main material, and the other one is the curing agent, the curing reaction occurs even without applying the heat to the adhesive member. Therefore, the electronic component DC or the display panel DP may be prevented from being damaged by the heat.

The method for manufacturing the display device in an embodiment includes the process of providing the first adhesive member between the plurality of bumps. In the process of providing the first adhesive member, at least a portion of the top surface of each of the bumps is exposed between the first adhesive members. Therefore, in the method for manufacturing the display device in an embodiment, the process time may be reduced. In addition, in the method for manufacturing the display device in an embodiment, the conductivity between the display panel and the electronic component may be improved.

According to the method for manufacturing the display device in the embodiment of the invention, the process time may be reduced.

According to the method for manufacturing the display device in the embodiment of the invention, the display device in which the conductivity between the display panel and the electronic component is improved may be provided.

It will be apparent to those skilled in the art that various modifications and variations may be made in the invention. Thus, it is intended that the invention covers the modifications and variations of this invention provided they come within the scope of the appended claims and their equivalents. Thus, to the maximum extent allowed by law, the scope of the invention is to be determined by the broadest permissible interpretation of the following claims and their equivalents, and shall not be restricted or limited by the foregoing detailed description.

What is claimed is:

1. A method for manufacturing a display device, the method comprising:
   providing an electronic component comprising a plurality of bumps on a base substrate;
   providing first adhesive members on the base substrate between the plurality of bumps;
   providing a display panel comprising a plurality of signal pads;
   aligning the electronic component and the display panel so that the plurality of bumps and the plurality of signal pads respectively correspond to each other and a top surface of each of the plurality of bumps faces the display panel; and
   applying ultrasonic waves and a pressure to the plurality of bumps and the plurality of signal pads to bond the plurality of bumps to the plurality of signal pads,
   wherein, in the providing the first adhesive members on the base substrate, at least a portion of the top surface of each of the plurality of bumps is exposed by the first adhesive members before the aligning the electronic component and the display panel.

2. The method of claim 1, wherein, in the providing the first adhesive members, the top surface of each of the plurality of bumps is exposed between the first adhesive members.

3. The method of claim 1, wherein, in the providing the first adhesive members, each of the plurality of bumps does not overlap each of the first adhesive members in a plan view.

4. The method of claim 1, wherein, in the providing the first adhesive members, each of the first adhesive members is provided to protrude between the plurality of bumps.

5. The method of claim 1, further comprising drying or partially curing the first adhesive members between the providing the first adhesive members and the aligning the electronic component and the display panel.

6. The method of claim 1, wherein, in the bonding the plurality of bumps to the plurality of signal pads, heat is applied to the plurality of bumps and the plurality of signal pads.

7. The method of claim 1, wherein each of the first adhesive members is a thermosetting adhesive member, and
   in the bonding the plurality of bumps to the plurality of signal pads, heat is applied to the first adhesive members.

8. The method of claim 1, further comprising providing second adhesive members between the plurality of signal pads.

9. The method of claim 8, wherein, in the providing the second adhesive members, at least a portion of the top surface of each of the plurality of signal pads is exposed between the second adhesive members.

10. The method of claim 8, wherein, in the providing the second adhesive members, the top surface of each of the plurality of signal pads is exposed between the second adhesive members.

11. The method of claim 8, wherein, in the providing the first adhesive members, each of the first adhesive members is provided so as not to protrude between the plurality of bumps.

12. The method of claim 8, wherein one of the first adhesive members and the second adhesive members comprises a main material, and a remaining one of the first adhesive member and the second adhesive member comprises a curing agent which curing-reacts with the main material.

13. The method of claim 12, wherein, in the applying the ultrasonic waves and the pressure to bond the plurality of bumps to the plurality of signal pads, the main material and the curing agent are mixed with each other.

14. A method for manufacturing a display device, the method comprising:
    providing an electronic component comprising a plurality of bumps on a base substrate;
    providing a display panel comprising a plurality of signal pads;
    providing first adhesive members on the base substrate between the plurality of bumps;
    aligning the electronic component and the display panel so that the plurality of bumps and the plurality of signal pads respectively correspond to each other and a top surface of each of the plurality of bumps faces the display panel; and
    applying ultrasonic waves and a pressure to bond the plurality of bumps to the plurality of signal pads,
    wherein, in the providing the first adhesive members on the base substrate, each of the first adhesive members does not overlap at least a portion of the top surface of each of the plurality of bumps in a plan view before the aligning the electronic component and the display panel.

15. The method of claim 14, wherein, in the providing the first adhesive members, each of the first adhesive members does not overlap each of the plurality of bumps in the plan view.

16. The method of claim 14, wherein, in the providing the first adhesive members to the electronic component, each of the first adhesive members is provided to protrude between the plurality of bumps.

17. The method of claim 14, further comprising drying or partially curing the first adhesive members between the providing of the first adhesive members to the electronic component and the aligning of the electronic component and the display panel.

18. The method of claim 14, further comprising providing second adhesive members between the plurality of signal pads,
    wherein, in the providing of the second adhesive members, each of the second adhesive members does not overlap each of the plurality of signal pads or overlaps each of the plurality of signal pads in the plan view.

19. The method of claim 18, wherein each of the first adhesive members is provided so as not to protrude between the plurality of bumps.

20. The method of claim 18, wherein each of the plurality of bumps has a thickness greater than a thickness of each of the plurality of signal pads,
- each of the first adhesive members comprises a main material, and
- each of the second adhesive members comprises a curing agent which curing-reacts with the main material.

* * * * *